(12) United States Patent
Englekirk

(10) Patent No.: US 10,951,210 B2
(45) Date of Patent: *Mar. 16, 2021

(54) TUNING CAPACITANCE TO ENHANCE FET STACK VOLTAGE WITHSTAND

(71) Applicant: pSemi Corporation, San Diego, CA (US)

(72) Inventor: Robert Mark Englekirk, Littleton, CO (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/813,459

(22) Filed: Mar. 9, 2020

(65) Prior Publication Data

US 2020/0280312 A1 Sep. 3, 2020

Related U.S. Application Data

(60) Division of application No. 15/829,773, filed on Dec. 1, 2017, now Pat. No. 10,622,992, which is a
(Continued)

(51) Int. Cl.
*H01L 21/00* (2006.01)
*H03K 17/687* (2006.01)
(Continued)

(52) U.S. Cl.
CPC ......... *H03K 17/6871* (2013.01); *H01H 11/00* (2013.01); *H03K 17/102* (2013.01);
(Continued)

(58) Field of Classification Search
None
See application file for complete search history.

(56) References Cited

U.S. PATENT DOCUMENTS 3,470,443 A 9/1969 Berry et al.
3,646,361 A 2/1972 Pfiffner
(Continued)

FOREIGN PATENT DOCUMENTS

DE 19832565 8/1999
EP 385641 9/1990
(Continued)

OTHER PUBLICATIONS

Patel, Reema, Office Action received from the USPTO dated Mar. 14, 2017 for U.S. Appl. No. 15/061,909, 7 pgs.
(Continued)

*Primary Examiner* — Reema Patel
(74) *Attorney, Agent, or Firm* — Jaquez Land Greenhaus LLP; Alessandro Steinfl, Esq.

(57) ABSTRACT

An RF switch to controllably withstand an applied RF voltage $V_{SW}$, or a method of fabricating such a switch, which includes a string of series-connected constituent FETs with a node of the string between each pair of adjacent FETs. The method includes controlling capacitances between different nodes of the string to effectively tune the string capacitively, which will reduce the variance in the RF switch voltage distributed across each constituent FET, thereby enhancing switch breakdown voltage. Capacitances are controlled, for example, by disposing capacitive features between nodes of the string, and/or by varying design parameters of different constituent FETs. For each node, a sum of products of each significant capacitor by a proportion of $V_{SW}$ appearing across it may be controlled to approximately zero.

9 Claims, 4 Drawing Sheets

Related U.S. Application Data continuation of application No. 15/061,909, filed on Mar. 4, 2016, now Pat. No. 9,866,212, which is a continuation of application No. 14/883,122, filed on Oct. 14, 2015, now Pat. No. 9,595,956, which is a continuation of application No. 14/028,357, filed on Sep. 16, 2013, now Pat. No. 9,177,737, which is a continuation of application No. 13/046,560, filed on Mar. 11, 2011, now Pat. No. 8,536,636, which is a division of application No. 11/796,522, filed on Apr. 26, 2007, now Pat. No. 7,960,772.

(51) Int. Cl.
| | |
|---|---|
| *H03K 17/10* | (2006.01) |
| *H03K 17/693* | (2006.01) |
| *H03K 17/16* | (2006.01) |
| *H01H 11/00* | (2006.01) |
| *H03K 17/06* | (2006.01) |

(52) U.S. Cl.
CPC ......... *H03K 17/161* (2013.01); *H03K 17/693* (2013.01); *H03K 2017/066* (2013.01); *Y10T 29/49105* (2015.01)

(56) References Cited

U.S. PATENT DOCUMENTS

| | | |
|---|---|---|
| 3,699,359 A | 10/1972 | Shelby |
| 3,731,112 A | 5/1973 | Smith |
| 3,878,450 A | 4/1975 | Greatbatch |
| 3,942,047 A | 3/1976 | Buchanan |
| 3,943,428 A | 3/1976 | Whidden |
| 3,955,353 A | 5/1976 | Astle |
| 3,975,671 A | 8/1976 | Stoll |
| 3,988,727 A | 10/1976 | Scott |
| 4,047,091 A | 9/1977 | Hutchines et al. |
| 4,061,929 A | 12/1977 | Asano |
| 4,068,295 A | 1/1978 | Portmann |
| 4,079,336 A | 3/1978 | Gross |
| 4,106,086 A | 8/1978 | Holbrook et al. |
| 4,186,436 A | 1/1980 | Ishiwatari |
| 4,241,316 A | 12/1980 | Knapp |
| 4,244,000 A | 1/1981 | Ueda et al. |
| 4,256,977 A | 3/1981 | Hendrickson |
| 4,306,203 A | 12/1981 | Sasaki et al. |
| 4,316,101 A | 2/1982 | Minner |
| 4,317,055 A | 2/1982 | Yoshida et al. |
| 4,321,661 A | 3/1982 | Sano |
| 4,367,421 A | 1/1983 | Baker |
| 4,390,798 A | 6/1983 | Kurafuji |
| 4,460,952 A | 7/1984 | Risinger |
| RE31,749 E | 11/1984 | Yamashiro |
| 4,485,433 A | 11/1984 | Topich |
| 4,564,843 A | 1/1986 | Cooper |
| 4,621,315 A | 11/1986 | Vaughn et al. |
| 4,633,106 A | 12/1986 | Backes et al. |
| 4,638,184 A | 1/1987 | Kimura |
| 4,679,134 A | 7/1987 | Bingham |
| 4,701,732 A | 10/1987 | Nestlerode |
| 4,703,196 A | 10/1987 | Arakawa |
| 4,736,169 A | 4/1988 | Weaver et al. |
| 4,739,191 A | 4/1988 | Puar |
| 4,746,960 A | 5/1988 | Valeri et al. |
| 4,752,699 A | 6/1988 | Cranford et al. |
| 4,769,784 A | 9/1988 | Doluca et al. |
| 4,777,577 A | 10/1988 | Bingham et al. |
| 4,810,911 A | 3/1989 | Noguchi |
| 4,825,145 A | 4/1989 | Tanaka et al. |
| 4,839,787 A | 6/1989 | Kojima et al. |
| 4,847,519 A | 7/1989 | Wahl et al. |
| 4,849,651 A | 7/1989 | Estes, Jr. |
| 4,890,077 A | 12/1989 | Sun |
| 4,891,609 A | 1/1990 | Eilley |
| 4,893,070 A | 1/1990 | Milberger et al. |
| 4,897,774 A | 1/1990 | Bingham et al. |
| 4,924,238 A | 5/1990 | Ploussios |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 4,999,585 A | 3/1991 | Burt et al. |
| 5,012,123 A | 4/1991 | Ayasli et al. |
| 5,023,494 A | 6/1991 | Tsukii et al. |
| 5,029,282 A | 7/1991 | Ito |
| 5,032,799 A | 7/1991 | Milberger et al. |
| 5,038,325 A | 8/1991 | Douglas et al. |
| 5,041,797 A | 8/1991 | Belcher et al. |
| 5,061,907 A | 10/1991 | Rasmussen |
| 5,061,911 A | 10/1991 | Weidman et al. |
| 5,068,626 A | 11/1991 | Takagi et al. |
| 5,081,371 A | 1/1992 | Wong |
| 5,081,706 A | 1/1992 | Kim |
| 5,111,375 A | 3/1992 | Marshall |
| 5,124,762 A | 6/1992 | Childs et al. |
| 5,126,590 A | 6/1992 | Chern |
| 5,138,190 A | 8/1992 | Yamazaki et al. |
| 5,146,178 A | 9/1992 | Nojima et al. |
| 5,182,529 A | 1/1993 | Chern |
| 5,193,198 A | 3/1993 | Yokouchi |
| 5,208,557 A | 5/1993 | Kersh, III |
| 5,212,456 A | 5/1993 | Kovalcik et al. |
| 5,272,457 A | 12/1993 | Heckaman et al. |
| 5,274,343 A | 12/1993 | Russell et al. |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,332,997 A | 7/1994 | Dingwall et al. |
| 5,345,422 A | 9/1994 | Redwine |
| 5,350,957 A | 9/1994 | Cooper et al. |
| 5,375,256 A | 12/1994 | Yokoyama et al. |
| 5,375,257 A | 12/1994 | Lampen |
| 5,392,186 A | 2/1995 | Alexander et al. |
| 5,392,205 A | 2/1995 | Zavaleta |
| 5,416,043 A | 5/1995 | Burgener et al. |
| 5,422,586 A | 6/1995 | Tedrow et al. |
| 5,442,327 A | 8/1995 | Longbrake et al. |
| 5,446,418 A | 8/1995 | Hara et al. |
| 5,448,207 A | 9/1995 | Kohama |
| 5,455,794 A | 10/1995 | Javanifard et al. |
| 5,465,061 A | 11/1995 | Dufour |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,519,360 A | 5/1996 | Keeth |
| 5,535,160 A | 7/1996 | Yamaguchi |
| 5,548,239 A | 8/1996 | Kohama |
| 5,553,021 A | 9/1996 | Kubono et al. |
| 5,553,295 A | 9/1996 | Pantelakis et al. |
| 5,554,892 A | 9/1996 | Norimatsu |
| 5,572,040 A | 11/1996 | Reedy et al. |
| 5,576,647 A | 11/1996 | Sutardja |
| 5,589,793 A | 12/1996 | Kassapian |
| 5,596,205 A | 1/1997 | Reedy et al. |
| 5,597,739 A | 1/1997 | Sumi et al. |
| 5,600,169 A | 2/1997 | Burgener et al. |
| 5,629,655 A | 5/1997 | Dent |
| 5,663,570 A | 9/1997 | Reedy et al. |
| 5,670,907 A | 9/1997 | Gorecki et al. |
| 5,672,992 A | 9/1997 | Nadd |
| 5,677,649 A | 10/1997 | Martin |
| 5,681,761 A | 10/1997 | Kim |
| 5,694,308 A | 12/1997 | Cave |
| 5,698,877 A | 12/1997 | Gonzalez |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,734,291 A | 3/1998 | Tasdighi et al. |
| 5,748,053 A | 5/1998 | Kameyama et al. |
| 5,757,170 A | 5/1998 | Pinney |
| 5,760,652 A | 6/1998 | Yamamoto et al. |

(56) References Cited

U.S. PATENT DOCUMENTS

| | | |
|---|---|---|
| 5,774,792 A | 6/1998 | Tanaka et al. |
| 5,784,687 A | 6/1998 | Itoh et al. |
| 5,777,530 A | 7/1998 | Nakatuka |
| 5,786,617 A | 7/1998 | Merrill et al. |
| 5,793,246 A | 8/1998 | Costello et al. |
| 5,801,577 A | 9/1998 | Tailliet |
| 5,807,772 A | 9/1998 | Takemura |
| 5,808,505 A | 9/1998 | Tsukada |
| 5,812,066 A | 9/1998 | Terk et al. |
| 5,812,939 A | 9/1998 | Kohama |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,800 A | 10/1998 | Le et al. |
| 5,825,227 A | 10/1998 | Kohama et al. |
| 5,861,336 A | 1/1999 | Reedy et al. |
| 5,863,823 A | 1/1999 | Burgener |
| 5,864,328 A | 1/1999 | Kajimoto |
| 5,872,489 A | 2/1999 | Chang et al. |
| 5,874,836 A | 2/1999 | Nowak et al. |
| 5,874,849 A | 2/1999 | Marotta et al. |
| 5,878,331 A | 3/1999 | Yamamoto et al. |
| 5,880,921 A | 3/1999 | Tham et al. |
| 5,883,396 A | 3/1999 | Reedy et al. |
| 5,883,541 A | 3/1999 | Tahara et al. |
| 5,889,428 A | 3/1999 | Young |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pastemak |
| 5,917,362 A | 6/1999 | Kohama |
| 5,920,233 A | 7/1999 | Denny |
| 5,926,466 A | 7/1999 | Ishida et al. |
| 5,930,638 A | 7/1999 | Reedy et al. |
| 5,945,867 A | 8/1999 | Uda et al. |
| 5,959,335 A | 9/1999 | Bryant et al. |
| 5,969,560 A | 10/1999 | Kohama et al. |
| 5,973,363 A | 10/1999 | Staab et al. |
| 5,973,382 A | 10/1999 | Burgener et al. |
| 5,973,636 A | 10/1999 | Okubo et al. |
| 5,986,518 A | 11/1999 | Dougherty |
| 5,990,580 A | 11/1999 | Weigand |
| 6,020,781 A | 2/2000 | Fujioka |
| 6,057,555 A | 5/2000 | Reedy et al. |
| 6,057,723 A | 5/2000 | Yamaji et al. |
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,694 A | 6/2000 | Matsuura et al. |
| 6,094,088 A | 7/2000 | Yano |
| 6,107,885 A | 8/2000 | Miguelez et al. |
| 6,114,923 A | 9/2000 | Mizutani |
| 6,118,343 A | 9/2000 | Winslow |
| 6,122,185 A | 9/2000 | Utsunomiya et al. |
| 6,130,572 A | 10/2000 | Ghilardelli et al. |
| 6,133,752 A | 10/2000 | Kawagoe |
| 6,163,238 A | 12/2000 | Nesterode |
| 6,169,444 B1 | 1/2001 | Thurber, Jr. |
| 6,177,826 B1 | 1/2001 | Mashiko et al. |
| 6,188,247 B1 | 2/2001 | Storino et al. |
| 6,188,590 B1 | 2/2001 | Chang et al. |
| 6,191,653 B1 | 2/2001 | Camp, Jr. et al. |
| 6,195,307 B1 | 2/2001 | Umezawa et al. |
| RE37,124 E | 4/2001 | Monk et al. |
| 6,215,360 B1 | 4/2001 | Callaway, Jr. |
| 6,218,890 B1 | 4/2001 | Yamaguchi et al. |
| 6,225,866 B1 | 5/2001 | Kubota et al. |
| 6,239,657 B1 | 5/2001 | Bauer |
| 6,249,446 B1 | 6/2001 | Shearon et al. |
| 6,265,925 B1 * | 7/2001 | Wong ............... H03K 17/693 327/308 |
| 6,288,458 B1 | 9/2001 | Berndt |
| 6,297,687 B1 | 10/2001 | Sugimura |
| 6,297,696 B1 | 10/2001 | Abdollahian et al. |
| 6,300,796 B1 | 10/2001 | Troutman et al. |
| 6,308,047 B1 | 10/2001 | Yamamoto et al. |
| 6,310,508 B1 | 10/2001 | Westerman |
| 6,316,983 B1 | 11/2001 | Kitamura |
| 6,337,594 B1 | 1/2002 | Hwang |
| 6,356,135 B1 | 3/2002 | Rastegar |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Sakai et al. |
| 6,380,802 B1 | 4/2002 | Pehike et al. |
| 6,392,440 B2 | 5/2002 | Nebel |
| 6,396,352 B1 | 5/2002 | Muza |
| 6,400,211 B1 | 6/2002 | Yokomizo et al. |
| 6,407,614 B1 | 6/2002 | Takahashi |
| 6,411,531 B1 | 6/2002 | Nork et al. |
| 6,414,863 B1 | 7/2002 | Bayer et al. |
| 6,429,632 B1 | 8/2002 | Forbes et al. |
| 6,429,723 B1 | 8/2002 | Hastings |
| 6,449,465 B1 | 9/2002 | Gallus et al. |
| 6,452,232 B1 | 9/2002 | Adan |
| 6,461,902 B1 | 10/2002 | Xu et al. |
| 6,486,511 B1 | 11/2002 | Nathanson et al. |
| 6,486,729 B2 | 11/2002 | Imamiya |
| 6,496,074 B1 | 12/2002 | Sowlati |
| 6,504,213 B1 | 1/2003 | Ebina |
| 6,509,799 B1 | 1/2003 | Franca-Neto |
| 6,512,269 B1 | 1/2003 | Bryant et al. |
| 6,518,829 B2 | 2/2003 | Butler |
| 6,537,861 B1 | 3/2003 | Kroell et al. |
| 6,559,689 B1 | 5/2003 | Clark |
| 6,563,366 B1 | 5/2003 | Kohama |
| 6,611,164 B2 | 8/2003 | Uno |
| 6,617,933 B2 | 9/2003 | Ito et al. |
| 6,642,578 B1 | 11/2003 | Arnold et al. |
| 6,653,697 B2 | 11/2003 | Hidaka et al. |
| 6,677,641 B2 | 1/2004 | Kocon |
| 6,683,499 B2 | 1/2004 | Lautzenhiser et al. |
| 6,684,065 B2 | 1/2004 | Bult |
| 6,693,498 B1 | 2/2004 | Sasabata et al. |
| 6,698,082 B2 | 3/2004 | Crenshaw et al. |
| 6,698,498 B1 | 3/2004 | Crenshaw et al. |
| 6,704,550 B1 | 3/2004 | Kohama et al. |
| 6,711,397 B1 | 3/2004 | Petrov et al. |
| 6,714,065 B2 | 3/2004 | Komiya et al. |
| 6,717,458 B1 | 4/2004 | Potanin |
| 6,747,522 B2 | 6/2004 | Peitruszynski et al. |
| 6,753,738 B1 | 6/2004 | Baird |
| 6,774,701 B1 | 8/2004 | Heston et al. |
| 6,781,805 B1 | 8/2004 | Urakawa |
| 6,788,130 B2 | 9/2004 | Pauletti et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,000 B2 | 11/2004 | Miyamitsu |
| 6,816,001 B2 | 11/2004 | Khouri et al. |
| 6,816,016 B2 | 11/2004 | Sander et al. |
| 6,819,938 B2 | 11/2004 | Sahota |
| 6,825,730 B1 | 11/2004 | Sun |
| 6,831,847 B2 | 12/2004 | Perry |
| 6,833,745 B2 | 12/2004 | Hausman et al. |
| 6,836,172 B2 | 12/2004 | Okashita |
| 6,870,404 B1 | 3/2005 | Maangat |
| 6,871,059 B1 | 3/2005 | Piro et al. |
| 6,879,502 B2 | 4/2005 | Yoshida et al. |
| 6,882,210 B2 | 4/2005 | Asano et al. |
| 6,889,036 B2 | 5/2005 | Ballweber et al. |
| 6,891,234 B1 | 5/2005 | Connelly et al. |
| 6,903,596 B2 | 6/2005 | Geller et al. |
| 6,906,653 B2 | 6/2005 | Uno |
| 6,917,258 B2 | 7/2005 | Kushitani et al. |
| 6,927,722 B2 | 8/2005 | Hong |
| 6,934,520 B2 | 8/2005 | Rozsypal |
| 6,947,720 B2 | 9/2005 | Razavi et al. |
| 6,968,167 B1 | 11/2005 | Wu |
| 6,975,271 B2 | 12/2005 | Adachi et al. |
| 6,978,122 B2 | 12/2005 | Kawakyu et al. |

(56) References Cited

U.S. PATENT DOCUMENTS

| | | | |
|---|---|---|---|
| 6,992,543 B2 | 1/2006 | Luetzelschwab et al. |
| 7,023,260 B2 | 4/2006 | Thorp et al. |
| 7,042,245 B2 | 5/2006 | Hidaka |
| 7,057,472 B2 | 6/2006 | Fukamachi et al. |
| 7,082,293 B1 | 7/2006 | Rofougaran et al. |
| 7,088,971 B2 | 8/2006 | Burgener et al. |
| 7,092,677 B1 | 8/2006 | Zhang et al. |
| 7,109,532 B1 | 9/2006 | Lee et al. |
| 7,123,898 B2 | 10/2006 | Burgener et al. |
| 7,129,545 B2 | 10/2006 | Cain |
| 7,132,873 B2 | 11/2006 | Hollmer |
| 7,138,846 B2 | 11/2006 | Suwa et al. |
| 7,161,197 B2 | 1/2007 | Nakatsuka et al. |
| 7,173,471 B2 | 2/2007 | Nakatsuka et al. |
| 7,190,933 B2 | 3/2007 | De Ruijter |
| 7,199,635 B2 | 4/2007 | Nakatsuka et al. |
| 7,212,788 B2 | 5/2007 | Weber et al. |
| 7,248,120 B2 | 7/2007 | Burgener et al. |
| 7,269,392 B2 | 9/2007 | Nakajima et al. |
| 7,299,018 B2 | 11/2007 | Van Rumpt |
| 7,307,490 B2 | 12/2007 | Kizuki |
| 7,310,215 B2 | 12/2007 | Pasternak |
| 7,345,342 B2 | 3/2008 | Challa |
| 7,345,521 B2 | 3/2008 | Takahashi et al. |
| 7,355,455 B2 | 4/2008 | Hidaka |
| 7,391,282 B2 | 6/2008 | Nakatsuka et al. |
| 7,432,552 B2 | 10/2008 | Park |
| 7,460,852 B2 | 12/2008 | Burgener et al. |
| 7,463,085 B2 | 12/2008 | Kim et al. |
| 7,515,882 B2 | 4/2009 | Kelcourse et al. |
| 7,546,089 B2 | 6/2009 | Bellantoni |
| 7,551,036 B2 | 6/2009 | Berroth et al. |
| 7,561,853 B2 | 7/2009 | Miyazawa |
| 7,659,152 B2 | 2/2010 | Gonzalez et al. |
| 7,714,676 B2 | 5/2010 | McKinzie |
| 7,719,343 B2 | 5/2010 | Burgener et al. |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,764,140 B2 | 7/2010 | Nagarkatti et al. |
| 7,772,648 B1 | 8/2010 | Ivanov et al. |
| 7,796,969 B2 | 9/2010 | Kelly et al. |
| 7,825,715 B1 | 11/2010 | Greenberg |
| 7,847,642 B2 | 12/2010 | Pretl |
| 7,860,499 B2 | 12/2010 | Burgener et al. |
| 7,910,993 B2 | 3/2011 | Brindle et al. |
| 7,928,759 B2 | 4/2011 | Hidaka |
| 7,960,772 B2 | 6/2011 | Englekirk |
| 7,982,265 B2 | 7/2011 | Challa et al. |
| 8,138,816 B2 | 3/2012 | Freeston et al. |
| 8,536,636 B2 | 9/2013 | Englekirk |
| 8,583,065 B2 | 11/2013 | Ben-Bassat |
| 8,583,111 B2 | 11/2013 | Burgener et al. |
| 8,604,864 B2 | 12/2013 | Ranta et al. |
| 8,638,159 B2 | 1/2014 | Ranta et al. |
| 8,669,804 B2 | 3/2014 | Ranta et al. |
| 8,803,631 B2 | 8/2014 | Manssen et al. |
| 8,847,666 B2 | 9/2014 | Chih-Sheng |
| 9,024,700 B2 | 5/2015 | Ranta |
| 9,087,899 B2 | 7/2015 | Brindle et al. |
| 9,106,227 B2 | 8/2015 | Ranta et al. |
| 9,177,737 B2 | 11/2015 | Englekirk |
| 9,197,194 B2 | 11/2015 | Reedy et al. |
| 9,225,378 B2 | 12/2015 | Burgener et al. |
| 9,293,262 B2 | 3/2016 | Bawell et al. |
| 9,496,849 B2 | 11/2016 | Ranta et al. |
| 9,595,956 B2 | 3/2017 | Englekirk |
| 9,667,227 B2 | 5/2017 | Ranta |
| 9,806,694 B2 | 10/2017 | Reedy et al. |
| 9,866,212 B2 | 1/2018 | Englekirk |
| 10,050,616 B2 | 8/2018 | Ranta et al. |
| 10,158,345 B2 | 12/2018 | Reedy et al. |
| 10,382,031 B2 | 8/2019 | Ranta |
| 10,622,992 B2 | 4/2020 | Englekirk |
| 2001/0031518 A1 | 10/2001 | Kim et al. |
| 2001/0040479 A1 | 11/2001 | Zhang |
| 2002/0115244 A1 | 8/2002 | Park et al. |
| 2002/0126767 A1 | 9/2002 | Ding et al. |
| 2003/0002452 A1 | 1/2003 | Sahota |
| 2003/0032396 A1 | 2/2003 | Tsuchiya et al. |
| 2003/0141543 A1 | 7/2003 | Bryant et al. |
| 2003/0160515 A1 | 8/2003 | Yu et al. |
| 2003/0181167 A1 | 9/2003 | Iida |
| 2003/0201494 A1 | 10/2003 | Maeda et al. |
| 2003/0224743 A1 | 12/2003 | Okada et al. |
| 2004/0061130 A1 | 4/2004 | Morizuka |
| 2004/0080364 A1 | 4/2004 | Sander et al. |
| 2004/0121745 A1 | 6/2004 | Meck |
| 2004/0129975 A1 | 7/2004 | Koh et al. |
| 2004/0204013 A1 | 10/2004 | Ma et al. |
| 2004/0242182 A1 | 12/2004 | Hikada et al. |
| 2005/0017789 A1 | 1/2005 | Burgener et al. |
| 2005/0068103 A1 | 3/2005 | Dupuis et al. |
| 2005/0077564 A1 | 4/2005 | Forbes |
| 2005/0079829 A1 | 4/2005 | Ogawa et al. |
| 2005/0121699 A1 | 6/2005 | Chen et al. |
| 2005/0212595 A1 | 9/2005 | Kusunoki et al. |
| 2005/0264341 A1 | 12/2005 | Hikita et al. |
| 2005/0285684 A1 | 12/2005 | Burgener et al. |
| 2005/0287976 A1 | 12/2005 | Burgener et al. |
| 2006/0009164 A1 | 1/2006 | Kataoka |
| 2006/0077082 A1 | 4/2006 | Shanks et al. |
| 2006/0160520 A1 | 7/2006 | Naoyuki |
| 2006/0194558 A1 | 8/2006 | Kelly |
| 2006/0194567 A1 | 8/2006 | Kelly et al. |
| 2006/0255852 A1 | 11/2006 | O'Donnell |
| 2006/0270367 A1 | 11/2006 | Burgener et al. |
| 2007/0018247 A1 | 1/2007 | Brindle et al. |
| 2007/0045697 A1 | 3/2007 | Cheng et al. |
| 2007/0076454 A1 | 4/2007 | Burstein et al. |
| 2007/0279120 A1 | 12/2007 | Brederlow et al. |
| 2007/0290744 A1 | 12/2007 | Adachi et al. |
| 2008/0076371 A1 | 3/2008 | Dribinsky et al. |
| 2008/0265978 A1 | 10/2008 | Englekirk |
| 2009/0039970 A1 | 2/2009 | Shen et al. |
| 2009/0134949 A1 | 5/2009 | He |
| 2009/0224843 A1 | 9/2009 | Radoias et al. |
| 2010/0219997 A1 | 9/2010 | Le Guillou |
| 2011/0001542 A1 | 1/2011 | Ranta |
| 2011/0001544 A1 | 1/2011 | Ranta |
| 2011/0002080 A1 | 1/2011 | Ranta |
| 2011/0043271 A1 | 2/2011 | Ranta |
| 2011/0163779 A1 | 7/2011 | Hidaka |
| 2011/0165759 A1 | 7/2011 | Englekirk |
| 2011/0227666 A1 | 9/2011 | Manssen |
| 2011/0316636 A1 | 12/2011 | Zhao |
| 2013/0208396 A1 | 8/2013 | Bawell et al. |
| 2013/0222075 A1 | 8/2013 | Reedy et al. |
| 2014/0165385 A1 | 6/2014 | Englekirk |
| 2014/0179374 A1 | 6/2014 | Burgener et al. |
| 2016/0191019 A1 | 6/2016 | Reedy et al. |
| 2016/0191050 A1 | 6/2016 | Englekirk |
| 2017/0026035 A1 | 1/2017 | Englekirk |
| 2018/0097509 A1 | 4/2018 | Reedy et al. |
| 2018/0159530 A1 | 6/2018 | Englekirk |
| 2019/0007042 A1 | 1/2019 | Ranta et al. |
| 2019/0123735 A1 | 4/2019 | Reedy et al. |
| 2020/0014382 A1 | 1/2020 | Ranta |
| 2020/0295750 A1 | 9/2020 | Ranta et al. |

FOREIGN PATENT DOCUMENTS

| | | |
|---|---|---|
| EP | 0622901 | 11/1994 |
| EP | 782267 | 7/1997 |
| EP | 913939 | 5/1999 |
| EP | 625831 | 11/1999 |
| EP | 1451890 | 2/2011 |
| EP | 2387094 | 11/2011 |
| EP | 2255443 | 11/2012 |
| EP | 2568608 | 3/2013 |
| EP | 2568608 | 5/2014 |
| EP | 2760136 | 7/2014 |
| EP | 2140494 | 6/2017 |
| EP | 2760136 | 5/2018 |

(56) References Cited

FOREIGN PATENT DOCUMENTS

| | | |
|---|---|---|
| EP | 3346611 | 7/2018 |
| GB | 2425401 | 10/2006 |
| JP | 55-75348 | 6/1980 |
| JP | 1254014 | 10/1989 |
| JP | 2161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | 6334506 | 12/1994 |
| JP | 7046109 | 2/1995 |
| JP | 7-70245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 08-307305 | 11/1996 |
| JP | 8330930 | 12/1996 |
| JP | 09-008621 | 1/1997 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 09163721 | 6/1997 |
| JP | 9163721 | 6/1997 |
| JP | 9181641 | 7/1997 |
| JP | 9186501 | 7/1997 |
| JP | 09200021 | 7/1997 |
| JP | 9200074 | 7/1997 |
| JP | 9238059 | 9/1997 |
| JP | 9243738 | 9/1997 |
| JP | 9270659 | 10/1997 |
| JP | 9284114 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10-242829 | 9/1998 |
| JP | 10242826 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-13611 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001089448 | 3/2001 |
| JP | 2001-119281 | 4/2001 |
| JP | 2001157487 | 5/2001 |
| JP | 2001156182 | 6/2001 |
| JP | 2001274265 | 10/2001 |
| JP | 2004515937 | 5/2002 |
| JP | 20002164441 | 6/2002 |
| JP | 2003060451 | 2/2003 |
| JP | 2003167615 | 6/2003 |
| JP | 2003-198248 A | 7/2003 |
| JP | 2003189248 | 7/2003 |
| JP | 2002156602 | 12/2003 |
| JP | 2004-147175 | 5/2004 |
| JP | 2004166470 | 6/2004 |
| JP | 2004199950 | 7/2004 |
| JP | 2005-203643 | 7/2005 |
| JP | 2006332778 | 12/2006 |
| JP | 5185369 | 1/2013 |
| JP | 5417346 | 11/2013 |
| JP | 5591356 | 8/2014 |
| JP | 5860857 | 12/2015 |
| KR | 1994027615 | 12/1994 |
| WO | WO95/23460 A1 | 8/1995 |
| WO | WO9806174 | 2/1998 |
| WO | WO9935695 | 7/1999 |
| WO | WO0227920 | 4/2002 |
| WO | 2006/038190 | 4/2006 |
| WO | 2007008044 | 1/2007 |
| WO | WO2007033045 A2 | 3/2007 |
| WO | 2007/060210 | 5/2007 |
| WO | WO2008133621 | 6/2008 |
| WO | WO2009108391 | 9/2009 |

OTHER PUBLICATIONS

Patel, Reema, Office Action received from the USPTO dated Jul. 3, 2017 for U.S. Appl. No. 15/061,909, 39 pgs.
Patel, Reema, Notice of Allowance received from the USPTO dated Sep. 20, 2017 for U.S. Appl. No. 15/061,909, 17 pgs.
Englekirk, Robert Mark, Response filed in the USPTO dated Mar. 24, 2017 for U.S. Appl. No. 15/061,909, 3 pgs.
Englekirk, Robert Mark, Response filed in the USPTO dated Aug. 7, 2017 for U.S. Appl. No. 15/061,909, 11 pgs.
Ranta, et al., Response filed in the USPTO dated Jan. 23, 2018 for U.S. Appl. No. 15/442,491, 8 pgs.
Puentes, Daniel Calrissian, Final Office Action received from the USPTO dated Feb. 8, 2018 for U.S. Appl. No. 15/442,491, 22 pgs.
Willoughby, Terrence Ronique, Office Action received from the USPTO dated Apr. 6, 2018 U.S. Appl. No. 15/688,658, 24 pgs.
Brosa, Anna-Maria, Extended Search Report received from the EPO dated Apr. 18, 2018 for appln. No. 18157696.8, 14 pgs.
Kelly, et al., "The State-of-the-Art of Silicon-on-Sapphire CMOS RF Switches" CSIC 2005 Digest, pp. 200-203 (4 pgs).
Puentes, Daniel Calrissian, Notice of Allowance received from the USPTO dated May 23, 2018 for U.S. Appl. No. 15/442,491, 9 pgs.
Patel, Reema, Office Action received from the USPTO dated Dec. 14, 2018 for U.S. Appl. No. 15/829,773, 5 pgs.
Patel, Reema, Office Action received from the USPTO dated May 1, 2019 for U.S. Appl. No. 15/829,773, 40 pgs.
Patel, Reema, Notice of Allowance received from the USPTO dated Aug. 14, 2019 for U.S. Appl. No. 15/829,773, 12 pgs.
Patel, Reema, Notice of Allowance received from the USPTO dated Nov. 29, 2019 for U.S. Appl. No. 15/829,773, 13 pgs.
Patel, Reema, Response to Rule 312 Communication received from the USPTO dated Feb. 13, 2020 for U.S. Appl. No. 15/829,773, 3 pgs.
Willoughby, Terrence Ronique, Notice of Allowance received from the USPTO dated Jul. 20, 2018 for U.S. Appl. No. 15/688,658, 11 pgs.
Itoh, et al., English translation of Office Action received from the JPO dated Aug. 28, 2018 for appln. No. 2017-102495, 2 pgs.
Rhaman, Hafizur, Office Action received from the USPTO dated Nov. 19, 2018 for U.S. Appl. No. 15/279,302, 82 pgs.
Puentes, Daniel Calrissian, Office Action received from the USPTO dated Dec. 18, 2018 for U.S. Appl. No. 16/025,922, 20 pgs.
Puentes, Danil Calrissian, Final Office Action received from the USPTO dated Apr. 10, 2019 for U.S. Appl. No. 16/025,922, 14 pgs.
Puentes, Danil Calrissian, Applicant-Initiated Interview Summary received from the USPTO dated Apr. 29 2019 for U.S. Appl. No. 16/025,922, 3 pgs.
Puentes, Danil Calrissian, Advisory Action received from the USPTO dated Jun. 24, 2019 for U.S. Appl. No. 16/025,922, 6 pgs.
Puentes, Danil Calrissian, Notice of Allowance received from the USPTO dated Aug. 19, 2019 for U.S. Appl. No. 16/025,922, 13 pgs.
Willoughby, Terrence Ronique, Office Action received from the USPTO dated Oct. 11, 2019 for U.S. Appl. No. 16/156,930, 33 pgs.
Brosa, Anna-Maria, Office Action received from the EPO dated Dec. 11, 2019 for appln. No. 18157696.8, 8 pgs.

(56) References Cited

OTHER PUBLICATIONS

Nguyen, Hai L., Notice of Allowance received from the USPTO dated Dec. 27, 2019 for U.S. Appl. No. 16/025,922, 12 pgs.
Englekirk, Robert Mark, Preliminary Amendment filed in the USPTO dated Feb. 23, 2018 for U.S. Appl. No. 15/829,773, 6 pgs.
PSEMI Corporation, Response filed in the USPTO dated Jan. 15, 2019 for U.S. Appl. No. 15/829,773, 6 pgs.
PSEMI Corporation, Response filed in the USPTO dated Aug. 1, 2019 for U.S. Appl. No. 15/829,773, 7 pgs.
PSEMI Corporation, Amendment After Allowance filed in the USPTO dated Jan. 9, 2020 for U.S. Appl. No. 15/829,773, 6 pgs.
Willoughby, Terrence Ronique, Final Office Action received from the USPTO dated Jun. 24, 2020 for U.S. Appl. No. 16/156,930, 30 pgs.
Newman, "Radiation Hardened Power Electronics", Intersil Corporation, 1999, pp. 1-4.
Kelly, Response and Terminal Disclaimer filed in the USPTO dated Mar. 2010 relating to U.S. Appl. No. 11/347,014.
Burgener, et al., Response filed in the USPTO dated May 2006 relating to U.S. Appl. No. 10/922,135.
Kelly, Response to Office Action mailed to USPTO relating to U.S. Appl. No. 11/351,342 dated Jan. 30, 2009.
"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Botto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
Rodgers, et al., "Silicon UTSi CMOS RFIC for CDMA Wireless Communications System", IEEE MTT-S Digest, 1999, pp. 485-488.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Reedy, et al., "Single Chip Wireless Systems Using SOI", IEEE International SOI Conference, 1999, pp. 8-11.
Stuber, et al., "SOI CMOS with High Performance Passive Components for Analog, RF and Mixed Signal Designs", IEEE International SOI Conference, 1998, pp. 99-100.
Chung, et al., "SOI MOSFET Structure with a Junction Type Body Contact for Suppression of Pass Gate Leakage", IEEE Transactions on Electron Devices, vol. 48, No. 7, Jul. 2001.
Rozeau, "SOI Technologies Overview for Low Power Low Voltage Radio Frequency Applications", Analog Integrated Circuits and Signal Processing, Nov. 2000, pp. 93-114.
Fukuda, et al., "SOI CMOS Device Technology", Special Edition on 21st Century Solutions, 2001, pp. 54-57.
Fukuda, et al., "SOI CMOS Device Technology", OKI Technical Review, 2001, pp. 54-57.
Kusunoki, et al., "SPDT Switch MMIC Using E/D Mode GaAs JFETs for Personal Communications", IEEE GaAs IC Symposium, 1992, pp. 135-138.
Caverly, et al., "SPICE Modeling of Microwave and RF Control Diodes", IEEE, 2000, pp. 28-31.

Kuang, et al., "SRAM Bitline Circuits on PD SOI: Advantages and Concerns", IEEE Journal of Solid State Circuits, vol. 32, No. 6, Jun. 1997.
Baker, et al., "Stacking Power MOSFETs for Use in High Speed Instrumentation", American Institute of Physics, 1992, pp. 5799-5801.
Sanders, "Statistical Modeling of SOI Devices for the Low Power Electronics Program", AET, Inc., 1995, pp. 1-109.
Maeda, et al., "Substrate Bias Effect and Source Drain Breakdown Characteristics in Body Tied Short Channel SOI MOSFETs", IEEE Transactions on Electron Devices, vol. 46, No. 1, Jan. 1999, pp. 151-158.
Makioka, et al., "Super Self Aligned GaAs RF Switch IC with 0.25dB Extremely Low Insertion Loss for Mobile Communication Systems", IEEE Transactions on Electron Devices, vol. 48, No. 8, Aug. 2001, pp. 1510-1514.
Karandikar, et al., "Technology Mapping for SOI Domino Logic Incorporating Solutions for the Parasitic Bipolar Effect", ACM, 2001, pp. 1-14.
Huang, et al., "TFSOI Can It Meet the Challenge of Single Chip Portable Wireless Systems", IEEE International SOI Conference, 1997, pp. 1-3.
Devlin, "The Design of Integrated Switches and Phase Shifters", 1999.
Edwards, et al., "The Effect of Body Contact Series Resistance on SOI CMOS Amplifier Stages", IEEE Transactions on Electron Devices, vol. 44, No. 12, Dec. 1997, pp. 2290-2294.
Hess, et al., "Transformerless Capacitive Coupling of Gate Signals for Series Operation of Power MOS Devices", IEEE, 1999, pp. 673-675.
Sleight, et al., "Transient Measurements of SOI Body Contact Effectiveness", IEEE Electron Device Letters, vol. 19, No. 12, Dec. 1998.
"uPG13xG Series L-Band SPDT Switch GaAs MMIC", NEC, 1996, pp. 1-30.
Reedy, et al., "UTSi Cmos: A Complete RF SOI Solution", Peregrine Semiconductor, 2001, pp. 1-6.
Hittite Microwave, "Wireless Symposium 2000 is Stage for New Product Introductions", Hittite Microwave, 2000, pp. 1-8.
Montoriol, et al., "3.6V and 4.8V GSM/DCS1800 Dual Band PA Application with DECT Capability Using Standard Motorola RFICs", 2000, pp. 1-20.
Wang, et al., "Efficiency Improvement in Charge Pump Circuits", IEEE Journal of Solid-State Circuits, vol. 32, No. 6, Jun. 1997, pp. 852-860.
Numata, et al., "A +2.4/0 V Controlled High Power GaAs SPDT Antenna Switch IC for GSM Application", IEEE Radio Frequency Integrated Circuits Symposium, 2002, pp. 141-144.
Huang, et al., "A 0.5-um CMOS T/R Switch for 900-MHz Wireless Applications", IEEE Journal of Solid-State Circuits, 2001, pp. 486-492.
Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs MMIC with Low-Distortion Cascade FET Mixer for Personal Handy-Phone System Terminals", IEEE, 1998, pp. 205-208.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Valeri, et al., "A Silicon-on-Insulator Circuit for High Temperature, High-Voltage Applications", IEEE, 1991, pp. 60-61.
Gu, et al., "A 2.3V PHEMT Power SP3T Antenna Switch IC for GSM Handsets", IEEE GaAs Digest, 2003, pp. 48-51.

(56) References Cited

OTHER PUBLICATIONS

Darabi, et al., "A 2.4GHz CMOS Transceiver for Bluetooth", IEEE, 2001, pp. 89-92.
Huang, et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Huang, et al., "A 900-MHz T/R Switch with a 0.8-dB Insertion Loss Implemented in a 0.5-um CMOA Process", IEEE Custom Integrated Circuits Conference, 2000, pp. 341-344.
Workman, et al., "A Comparative Analysis of the Dynamic Behavior of BTG/SOI MOSFET's and Circuite with Distributed Body Resistance", IEEE Transactions and Electron Devices, vol. 45, No. 10, Oct. 1998, pp. 2138-2145.
Valeri, et al., "A Composite High Voltage Device Using Low Voltage SOI MOSFET's", IEEE, 1990, pp. 169-170.
Miyatsuji, et al., "A GaAs High Power RF Single Pole Double Throw Switch IC for Digital Mobile Communication System", IEEE International Solid-State Circuits Conference, 1994, pp. 34-35.
Miyatsuji, et al., "A GaAs High Power RF Single Pole Dual Throw Switch IC for Digital Mobile Communication System", IEEE Journal of Solid-State Circuits, 1995, pp. 979-983.
Puechberty, et al., "A GaAs Power Chip Set for 3V Cellular Communications", 1994.
Yamamoto, et al., "A GaAs RD Transceiver IC for 1.9GHz Digital Mobile Communication Systems", ISSCC96, 1996, pp. 340-341, 469.
Choumei, et al., "A High Efficiency, 2V Single Supply Voltage Operation RF Front End MMIC for 1.9GHz Personal Handy Phone Systems", IEEE, 1998, pp. 73-76.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp. 173-176.
Tinella, et al., "A High Performance CMOS-SOI Antenna Switch for the 2.5-5-GHz Band", IEEE Journal of Solid-State Circuits, 2003, pp. 1279-1283.
Gu, et al., "A High Performance GaAs SP3T Switch for Digital Cellular Systems", IEEE MTT-S Digest, 2001, pp. 241-244.
Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.
Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Giugni, "A Novel Multi-Port Microwave/Millimeter-Wave Switching Circuit", Microwave Conference, 2000.

Caverly, "A Project Oriented Undergraduate CMOS Analog Microelectronic System Design Course", IEEE, 1997, pp. 87-88.
Harjani, et al., "A Prototype Framework for Knowledge Based Analog Circuit Synthesis", IEEE Design Automation Conference, 1987, pp. 42-49.
DeRossi, et al., "A Routing Switch Based on a Silicon-on-Insulator Mode Mixer", IEEE Photonics Technology Letters, 1999, pp. 194-196.
Kanda, et al., "A Si RF Switch MMIC for the Cellular Frequency Band Using SOI-CMOS Technology", The Institute of Electronics, Information and Communication Engineers, 2000, pp. 79-83.
Caverly, et al., "A Silicon CMOS Monolithic RF and Microwave Switching Element", 27th European Microwave Conference, 1997, pp. 1046-1051.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
Koudymov, et al., "Low Loss High Power RF Switching Using Multifinger AlGaN/GaN MOSHFETs", University of South Carolina Scholar Commons, 2002, pp. 449-451.
Abidi, "Low Power Radio Frequency IC's for Portable Communications", IEEE, 1995, pp. 544-569.
Kuo, et al., "Low Voltage SOI CMOS VLSI Devices and Circuits", Wiley, 2001, pp. 57-60, 349-354.
Wei, et al., "Measuremenets of Transient Effects in SOI DRAM/SRAM Access Transistors", IEEE Electron Device Letters, vol. 17, No. 5, May 1996.
De La Houssaye, et al., "Microwave Performance of Optically Fabricated T-Gate Thin Film Silicon on Sapphire Based MOSFET's", IEEE Electron Device Letters, 1995, pp. 289-292.
Smuk, et al., "Monolithic GaAs Multi-Throw Switches with Integrated Low Power Decoder/Driver Logic", 1997, IEEE Radio Frequency Integrated Circuits.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.
Tieu, Notice of Allowance and Fee(s) Due from the USPTO dated May 2004 relating to U.S. Appl. No. 10/267,531.
Tieu, Notice of Allowance and Fee(s) Due from the USPTO dated Jul. 2008 relating to U.S. Appl. No. 11/582,206.
Tieu, Notice of Allowance and Fee(s) Due from the USPTO dated Jun. 2006 relating to U.S. Appl. No. 10/922,135.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Apr. 2010 relating to U.S. Appl. No. 11/347,014.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
Miyajima, Notice of Reasons for Refusal from the Japanese Patent Office dated Feb. 2006 relating to appln. No. 2003-535287.
McGrath, et al., "Novel High Performance SPDT Power Switches Using Multi-Gate FET's", IEEE, 1991, pp. 839-842.
Tieu, Office Action from the USPTO dated Nov. 2007 relating to U.S. Appl. No. 11/582,206.
Tieu, Office Action from the USPTO dated Jun. 2005 relating to U.S. Appl. No. 10/922,135.
Tieu, Notice of Allowance from the USPTO dated Jun. 2006 relating to U.S. Appl. No. 10/922,135.
Chow, Office Action from the USPTO dated Apr. 2010 relating to U.S. Appl. No. 11/347,671.
Tieu, Office Action from the USPTO dated Sep. 2009 relating to U.S. Appl. No. 11/347,014.

(56) References Cited

OTHER PUBLICATIONS

Luu, Office Action from the USPTO dated Oct. 2008 relating to U.S. Appl. No. 11/351,342.
Chow, Office Action from the USPTO dated Aug. 2010 relating to U.S. Appl. No. 11/347,671.
Suematsu, "On-Chip Matching SI-MMIC for Mobile Communication Terminal Application", IEEE, 1997, pp. 9-12.
Caverly, et al., "On-State Distortion in High Electron Mobility Transistor Microwave and RF Switch Control Circuits", IEEE Transactions on Microwave Theory and Techniques, 2000, pp. 98-103.
Kelly, Proposed Amendment After Final from the USPTO dated Jun. 2009 relating to U.S. Appl. No. 11/351,342.
"Radiation Hardened CMOS Dual DPST Analog Switch", Intersil, 1999, pp. 1-2.
Gibson, "The Communication Handbook", CRC Press, 1997.
Hanzo, "Adaptive Wireless Transceivers", Wiley, 2002.
Itoh, "RF Technologies for Low Power Wireless Communications", Wiley, 2001.
Lossee, "RF Systems, Components, and Circuits Handbook", Artech House, 1997.
Miller, "Modern Electronic Communications", Prentice-Hall, 1999.
Minoli, "Telecommunications Technology Handbook", Artech House, 2003.
Morreale, "The CRC Handbook of Modern Telecommunication", CRC Press, 2001.
Sayre, "Complete Wireless Design", McGraw-Hill, 2001.
Schaper, "Communications, Computations, Control, and Signal Processing", Kluwer Academic, 1997.
Shafi, "Wireless Communications in the 21st Century", Wiley, 2002.
Willtert-Porada, "Advances in Microwave Frequency Processing", Springer, 2009.
Dang, Hung Q., Notice of Allowance received from the USPTO dated Oct. 1, 2012 for related U.S. Appl. No. 12/735,954, 67 pgs.
Caverly, "Development of a CMOS Cell Library for RF Wireless and Telecommunications Applications", VLSI Symposium, 1998.
Caverly, "Distortion Properties of Gallium Arsenide and Silicon RF and Microwave Switches", IEEE, 1997, pp. 153-156.
Luu, Final Office Action received from the USPTO dated Apr. 2009 relating to U.S. Appl. No. 11/351,342.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Lee, et al., "Harmonic Distortion Due to Narrow Width Effects in Deep Submicron SOI-CMOS Device for Analog RF Applications", 2002 IEEE International SOI Conference, Oct. 2002.
HI-5042 thru HI-5051 Datasheet, Harris Corporation, 1999.
Eisenberg, et al., "High Isolation 1-20GHz MMIC Switches with On-Chip Drivers", IEEE Microwave and Millimeter-Wave Monolithic Circuits Symposium, 1989, pp. 41-45.
Kohama, et al., "High Power DPDT Antenna Switch MMIC for Digital Cellular Systems", GaAs IC Symposium, 1995, pp. 75-78.
Kohama, et al., "High Power DPDT Antenna Switch MMIC for Digital Cellular Systems", IEEE Journal of Solid-State Circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.

Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Suehle, et al., "Low Electric Field Breakdown of Thin SiO2 Films Under Static and Dynamic Stress", IEEE Transactions on Electron Devices, vol. 44, No. 5, May 1997.
Kanda, et al., "High Performance 19GHz Band GaAs FET Switches Using LOXI (Layerd Oxide Isolation—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Hirano, et al., "Impact of Actively Body Bias Controlled (ABC) SOI SRAM by Using Direct Body Contact Technology for Low Voltage Application", IEEE, 2003, pp. 2.4.1-2.4.4.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Kelly, "Integrated Ultra CMIS Designs in GSM Front End", Wireless Design Magazine, 2004, pp. 18-22.
Bonkowski, et al., "Integraton of Triple Band GSM Antenna Switch Module Using SOI CMOS", IEEE Radio Frequency Integrated Circuits Symposium, 2004, pp. 511-514.
Le, International Search Report from the USPTO dated Mar. 2003 relating to U.S. Appl. No. 10/267,531.
Marenk, et al., "Layout Optimization of Cascode RF SOI Transistors", IEEE International SOI Conference, 2001, pp. 105-106.
Suematsu, et al., "L-Band Internally Matched Si-MMIC Front End", IEEE, 1996, pp. 2375-2378.
Adan, et al., "Linearity and Low Noise Performance of SOIMOSFETs for RF Applications", IEEE International SOI Conference, 2000, pp. 30-31.
Megahed, et al., "Low Cost UTSi Technology for RF Wireless Applications", IEEE MTT-S Digest, 1998.
Yamamoto, et al., "A Single-Chip GaAs RF Transceiver for 1.9GHz Digital Mobile Communication Systems", IEEE Journal of Solid-State Circuits, vol. 31, No. 12, Dec. 1996, pp. 1964-1973.
Tsutsumi, et al., "A Single Chip PHS Front End MMIC with a True Single +3 Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5GHz, IEEE Transactions on Electron Devices, 1997, pp. 1981-1989.
Hu, et al., "A Unified Gate Oxide Reliability Model", IEEE 37th Annual International Reliability Physic Symposium, 1999, pp. 47-51.
Szedon, et al., "Advanced Silicon Technology for Microwave Circuits", Naval Research Laboratory, 1994, pp. 1-110.
Johnson, et al., "Advanced Thin Film Silicon-on-Sapphire Technology: Microwave Circuit Applications", IEEE Transactions on Electron Devices, 1998, pp. 1047-1054.

(56) References Cited

OTHER PUBLICATIONS

Burgener, et al., Amendment filed in the USPTO dated Dec. 2005 relating to U.S. Appl. No. 10/922,135.
Burgener, et al., Amendment filed in the USPTO dated May 2008 relating to U.S. Appl. No. 11/582,206.
Kai, An English translation of an Office Action received from the Japanese Patent Office dated Jul. 2010 relating to appln. No. 2007-518298.
Burgener, et al., Amendment filed in the USPTO dated Apr. 2010 relating to U.S. Appl. No. 11/501,125.
Heller, et al., "Cascode Voltage Switch Logic: A Different CMOS Logic Family", IEEE International Solid-State Circuits Conference, 1984, pp. 16-17.
Pylarinos, "Charge Pumps: An Overview", Proceedings of the IEEE International Symposium on Circuits and Systems, 2003, pp. 1-7.
Doyama, "Class E Power Amplifier for Wireless Transceivers", University of Toronto, 1999, pp. 1-9.
"CMOS Analog Switches", Harris, 1999, pp. 1-9.
Madihian, et al., "CMOS RF Ics for 900MHz-2.4GHz Band Wireless Communication Networks", IEEE Radio Frequency Integrated Circuits Symposium, 1999, pp. 13-16.
"CMOS SOI RF Switch Family", Honeywell, 2002, pp. 1-4.
"CMOS SOI Technology", Honeywell, 2001, pp. 1-7.
Analog Devices, "CMOS, Low Voltage RF/Video, SPST Switch", Analog Devices, inc., 1999, pp. 1-10.
Eggert, et al., "CMOS/SIMOX-RF-Frontend for 1.7GHz", Solid State Circuits Conference, 1996.
Orndorff, et al., CMOS/SOS/LSI Switching Regulator Control Device, IEEE International, vol. XXI, Feb. 1978, pp. 234-235.
Burgener, et al., Comments on Examiners Statements of Reasons for Allowance filed in the USPTO dated Aug. 2004 relating to U.S. Appl. No. 10/267,531.
Aquilani, Communication and supplementary European Search Report dated Nov. 2009 relating to appln. No. 05763216.
Van Der Peet, Communications pursuant to Article 94(3) EPC received from the EPO dated Jun. 2008 relating to appln. No. 02800982.7-2220.
Aquilani, Communications pursuant to Article 94(3) EPC received from the EPO dated Mar. 2010 relating to appln. No. 05763216.8.
Weman, Communication under Rule 71(3) EPC and Annex Form 2004 received from the EPO dated Nov. 2009 relating to appln. No. 020800982.7.
Van Der Peet, Communications pursuant to Article 94(3) EPC dated Aug. 2009 relating to appln. No. 02800982.7-2220.
Yamamoto, et al., "Design and Experimental Results of a 2V-Operation Single-Chip GaAs T/R MMIC Front-End for 1.9GHz Personal Communications", IEEE, 1998, pp. 7-12.
Savla, "Design and Simulation of a Low Power Bluetooth Transceiver", The University of Wisconsin, 2001, pp. 1-90.
Henshaw, "Design of an RF Transceiver", IEEE Colloquium on Analog Signal Processing, 1998.
Baker, et al., "Designing Nanosecond High Voltage Pulse Generators Using Power MOSFET's", Electronic Letters, 1994, pp. 1634-1635.
Wong, Alan, Office Action received from the USPTO dated Sep. 12, 2014 for U.S. Appl. No. 13/595,893, 11 pgs.
Peregrine Semiconductor Corporation, Response filed in the EPO dated Oct. 14, 2014 for appln. No. 10011669.8, 30 pgs.
Dang, Hung Q., Notice of Allowance received from the USPTO dated Nov. 18, 2014 for U.S. Appl. No. 12/735,954, 33 pgs.
Ranta, et al., Response filed in the USPTO dated Nov. 12, 2014 for U.S. Appl. No. 14/178,116, 8 pgs.
Ichikawa, Takenori, Office Action and English translation received from the JPO dated Nov. 18, 2014 for appln. No. 2013-181032, 15 pgs.
Wong, Alan, Notice of Allowance received from the USPTO dated Nov. 21, 2014 for U.S. Appl. No. 13/586,738, 205 pgs.
Burgener, et al., Response filed in the USPTO dated Nov. 24, 2014 for U.S. Appl. No. 14/062,791, 8 pgs.

Peregrine Semiconductor Corporation, Response filed in the EPO dated Dec. 10, 2014 for appln. No. 14165804.7, 76 pgs.
Reedy, et al., Response filed in the USPTO dated Dec. 12, 1 for U.S. Appl. No. 13/595,893, 24 pgs.
Tieu, Binh Kien, Notice of Allowance received from the USPTO dated Jan. 23, 2015 for U.S. Appl. No. 14/062,791, 8 pgs.
Weman, Eva, Communication of a notice of opposition received from the EPO dated Nov. 8, 2011 for related appln No. 028000982.7-2220, 33 pgs.
Caverly, Robert H., "Linear and Nonlinear Characteristics of the Silicon CMOS Monolithic 50-Ω Microwave and RF Control Element", IEEE Journal of Solid-State Circuits, vol. 34, No. 1, Jan. 1999, pp. 124-126.
Philips Semiconductors, Product Specification, IC17 Data Handbook, Nov. 7, 1997, pp. 1-14.
Iyama, Yoshitada, et al., "L-Bank SPDT Switch Using Si-MOSFET", IEICE Trans. Electronic, vol. E-79-C, No. 5, May 1996, pp. 636-643.
Yamamoto, Kazuya, et al., "A 2.2-V Operating, 2.4-GHz Single-Chip GaAs MMIC Transceiver for Wireless Applications", IEEE Journal of Solid-State Circuits, vol. 34, No. 4, Apr. 1999, pp. 502-512.
Unterberger, Michael, Extended Search Report received from the EPO dated Sep. 30, 2011 for related appln. No. 10011669.8, 9 pgs.
Le, Dinh Thanh, Office Action received from the USPTO dated Dec. 1, 2011 for related appln. No. 12/803,064, 23 pgs.
Peregrine Semiconductor Corporation, Response filed in the EPO dated Feb. 10, 2012 for related appln .No. 09715932.1, 47 pgs.
Cole, Brandon S., Office Action received from the USPTO dated Feb. 24, 2012 for related U.S. Appl. No. 12/803,133, 36 pgs.
Ranta, Tero Tapio, Amendment filed in the USPTO dated Mar. 21, 2012 for related U.S. Appl. No. 12/735,954, 16 pgs.
Peregrine Semiconductor Corporation, Response to Notice of Opposition filed in the EPO dated Apr. 17, 2012 for related patent No. 1451890, 42 pgs.
Burgener, et al., First Preliminary Amendment filed in the USPTO dated Apr. 27, 2012 for related U.S. Appl. No. 12/980,161, 21 pgs.
Ranta, et al., Amendment submitted with RCE filed in the USPTO dated Apr. 30, 2012 for related U.S. Appl. No. 12/803,064, 16 pgs.
Kurisu, Masakazu, Japanese Office Action and translation thereof dated Apr. 17, 2012 for related appln. No. 2010-506156, 4 pgs.
Peregrine Semiconductor Corporation, Response filed in the EPO dated May 15, 2012 for related appln. No. 10011669.8, 19 pgs.
Ranta, et al., Response filed in the USPTO dated May 23, 2012 for related U.S. Appl. No. 12/803,133, 7 pgs.
Le, Dinh Thanh, Office Action received from the USPTO dated Jun. 13, 2012 for related U.S. Appl. No. 12/803,064, 14 pgs.
Cole, Brandon S., Notice of Allowance received from the USPTO dated Jun. 8, 2012 for related U.S. Appl. No. 12/803,133, 12 pgs.
Theunissen, Lars, Communication under Rule 71(3) EPC received from the EPO dated Jul. 2, 2012 for related appln. No. 09715932.1, 98 pgs.
Dang, Hung Q., Notice of Allowance received from the USPTO dated Jul. 12, 2012 for related U.S. Appl. No. 12/735,954, 20 pgs.
Peregrine Semiconductor Corporation, Response filed in the EPO dated Sep. 11, 2013 for appln. No. 1219418.6, 16 pgs.
Ranta, et al., Response filed in the USPTO dated Sep. 17, 2013 for U.S. Appl. No. 12/803,139, 14 pgs.
Volker, Simon, Communication pursuant to Article 94(3) EPC received from the EPO dated Sep. 24, 2013 for appln. No. 07794407.2, 5 pgs.
Tieu, Binh Kien, Notice of Allowance received from the USPTO dated Sep. 30, 2013 for U.S. Appl. No. 12/980,161, 8 pgs.
Unterberger, M, Summons to attend oral proceedings pursuant to Rule 115(1) EPC for appln. No. 02800982.7, 15 pgs.
Rojas, Daniel E. Notice of Allowance received from the USPTO dated Oct. 22, 2013 for U.S. Appl. No. 12/803,139, 142 pgs.
Funakoshi, Ryo, Japanese Office Action and English translation received from the JPO dated Oct. 29, 2013 for appln. No. 2013-006353, 15 pgs.
Brosa, Anna-Maria, Communication under Rule 71(3) EPC received from the EPO dated Nov. 12, 2013 for appln. No. 12194187.6, 94 pgs.

(56) References Cited

OTHER PUBLICATIONS

Peregrine Semiconductor Corporation, Response to Summons filed in the EPO dated Jan. 9, 2014 for appln. No. 02800982.7, 21 pgs.
Schussler, Andrea, Report regarding Opposition Conclusion received from associated dated Feb. 25, 2014 for appln. No. 02800982.7, 13 pgs.
Dang, Hung Q., Office Action received from the USPTO dated Feb. 26, 2014 for U.S. Appl. No. 12/735,954, 34 pgs.
Unterberger, Michael, Communication pursuant to Article 101(1) and Rule 81(2) to (3) EPC received from the EPO dated Mar. 3, 2014 for appln. No. 02800982.7, 3 pgs.
Weman, Eva, Provision of the minutes in accordance with Rule 124(4) EPC received from the EPO dated Apr. 10, 2014 for appln. No. 02800982.7, 9 pgs.
Gonzalez, Brosa, Decision to grant a European patent pursuant to Article 97(1) EPC received from the EPO dated Apr. 17, 2014 for appln. No. 12194187.6, 1 pg.
European Patent Office, Noting of loss of rights pursuant to Rule 112(1) EPC received from the EPO dated May 2, 2014 for appln. No. 07794407.2, 1 pgs.
Brosa, Anna-Maria, Extended Search Report received from the EPO dated May 27, 2014 for appln. No. 14165804.7, 8 pgs.
Tieu, Binh Kien, Office Action received from the USPTO dated Jun. 24, 2014 for U.S. Appl. No. 14/062,791, 7 pgs.
Ranta, Tero, Amendment filed in the USPTO dated Jun. 26, 2014 for U.S. Appl. No. 12/735,954, 33 pgs.
Peregrine Semiconductor Corporation, Response filed in the EPO dated Jul. 11, 2014 for appln. No. 07794407.2, 32 pgs.
European Patent Office, Communication pursuant to Rule 58 EPC received from the EPO dated Jul. 21, 2014 for appln. No. 07794407.2, 5 pgs.
Peregrine Semiconductor Corporation, Response filed in the EPO dated Jul. 30, 2014 for appln. No. 07794407.2, 25 pgs.
Rojas, Daniel E., Office Action received from the USPTO dated Aug. 12, 2014 for U.S. Appl. No. 14/178,816, 9 pgs.
Bawell, et al., Comments on Examiners Statement of Reasons for Allowance filed in the USPTO dated Feb. 23, 2015 for U.S. Appl. No. 13/586,738, 3 pgs.
Wong, Alan, Final Office Action received from the USPTO dated Mar. 4, 2015 for U.S. Appl. No. 13/595,893, 33 pgs.
Puentes, Daniel, Notice of Allowance received from the USPTO dated Mar. 31, 2015 for U.S. Appl. No. 14/178,116, 181 pgs.
Tieu, Binh Kien, Notice of Allowance received from the USPTO dated May 14, 2015 for U.S. Appl. No. 14/062,791, 211 pgs.
Ranta, Tero Tapio, Preliminary Amendment filed in the USPTO dated Jul. 8, 2015 for U.S. Appl. No. 14/638,917, 8 pgs.
Wong, Alan, Notice of Allowance received from the USPTO dated Aug. 17, 2015 for U.S. Appl. No. 13/595,893, 12 pgs.
Stuber, et al., Response/Amendment and Terminal Disclaimers filed in the USPTO dated Jul. 27, 2015 for U.S. Appl. No. 13/948,094, 26 pgs.
Tieu, Binh Kien, Notice of Allowance received from the USPTO dated Sep. 4, 2015 for U.S. Appl. No. 14/062,791, 12 pgs.
Peregrine Semiconductor Corporation, Response filed in the EPO dated Sep. 10, 2015 for appln. No. 14165804.7, 14 pgs.
Le, Dinh Thanh, Office Action received from the USPTO dated Sep. 22, 2015 for U.S. Appl. No. 14/165,422, 4 pgs.
Rahman, Hafizur, Office Action received from the USPTO dated Nov. 2, 2020 for U.S. Appl. No. 16/524,710, 68 pgs.
"An Ultra-Thin Silicon Technology that Provides Integration Solutions on Standard CMOS", Peregrine Semiconductor, 1998.
Caverly, "Distortion in Microwave Control Devices", 1997.
Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Marshall, "SOI Design: Analog, Memory and Digital Techniques", Kluwer Academic Publishers, 2002.

Bernstein, "SOI Circuit Design Concepts", IBM Microelectronics, 2007.
Brinkman, Paul, et al., "Respondents' Notice of Prior Art", Aug. 31, 2012, 59 pgs.
Le, Dinh Thanh, Office Action received from the USPTO dated Nov. 20, 2013 for related U.S. Appl. No. 12/803,064, 6 pgs.
Simon, Volker, Communication Pursuant to Article 94(3) EPC dated Nov. 16, 2012 for related appln,. No. 09174085.2, 8 pgs.
Dang, Hung Q., Notice of Allowance received from the USPTO dated Jan. 25, 2013 for related U.S. Appl. No. 12/735,954, 42 pgs.
Rojas, Daniel, Office Action received from the USPTO dated Feb. 21, 2013 for related U.S. Appl. No. 12/803,139, 7 pgs.
Tieu, Binh Kien, Office Action received from the USPTO dated Feb. 19, 2013 for related U.S. Appl. No. 12/980,161, 97 pgs.
Ranta, et al., Response After Final filed in the USPTO dated Jan. 22, 2013 for related U.S. Appl. No. 12/803,064, 7 pgs.
Le, Dinh Thanh, Advisory Action received from the USPTO dated Feb. 6, 2013 for related U.S. Appl. No. 12/803,064, 2 pgs.
Ranta, et al., Second Response After Final filed in the USPTO dated Feb. 20, 2013 for related U.S. Appl. No. 12/803,064, 9 pgs.
Le, Dinh Thanh, Notice of Allowance received from the USPTO dated Mar. 4, 2013 for related U.S. Appl. No. 12/803,064, 6 pgs.
Brosa, Anna-Maria, European Search Report received from the EPO dated Feb. 1, 2013 for related appln. No. 12194187, 10 pgs.
Dang, Hung Q., Notice of Allowance received from USPTO dated May 10, 2013 for related U.S. Appl. No. 12/735,954, 22 pgs.
Ranta, et al., Response to Office Action filed in USPTO dated May 20, 2013 for related U.S. Appl. No. 12/803,139, 8 pgs.
Peregrine Semiconductor Corporation, Response filed in the EPO dated May 23, 2013 for related appln. No. 09174085.2, 16 pgs.
Patel, Reema, Office Action received from the USPTO dated Dec. 5, 2011 for U.S. Appl. No. 13/046,560, 13 pgs.
Englekirk, Robert Mark, Amendment filed in the USPTO dated Mar. 5, 2012 for U.S. Appl. No. 13/046,560, 4 pgs.
Patel, Reema, Notice of Allowance received from the USPTO dated May 24, 2012 for U.S. Appl. No. 13/046,560, 15 pgs.
Parwl, Reema, Notice of Allowance received from the USPTO dated Mar. 15, 2013 for U.S. Appl. No. 13/046,560, 10 pgs.
Englekirk, Robert Mark, Comments on Examiner's Statement of Reasons for Allowance filed in the USPTO dated Jun. 7, 2013 for U.S. Appl. No. 13/046,560, 3 pgs.
Ranta, Tero Tapio, Comments on Examiner's Statement of Reasons for Allowance filed in the USPTO dated Feb. 18, 2015 for U.S. Appl. No. 12/735,954, 3 pgs.
Mishra, et al., "High Power Broadband Amplifiers for 1-18 GHz Naval Radar" University of California, Santa Barbara, pp. 1-9, Jul. 1, 1998.
Perraud, et al., "A Direct-Conversion CMOS Transceiver for the 802.11a/b/g WLAN Standard Utilizing a Cartesian Feedback Transmitter", IEEE Journal of Solid-State Circuits, vol. 39, No. 12, Dec. 2004, pp. 2226-2238.
Rohde, et al., "Optic/Millimeter-Wave Converter for 60 Ghz Radio-Over-Fiber Systems", Fraunhofer-Institut für Angewandte Festkörperphysik Freiburg i. Br., Apr. 1997, pp. 1-5.
Darabi, et al. "A Dual-Mode 802.11b/Bluetooth Radio in 0.35-•m CMOS", IEEE Journal of Solid-State Circuits, vol. 40, No. 3, Mar. 2005, pp. 698-706.
Schlechtweg, et al., "Multifunctional Integration Using HEMT Technology", Fraunhofer Institute for Applied Solid State Physics, (date uncertain, believed Mar. 1997).
Chow, Charles Chiang, Office Action received from the USPTO dated Mar. 2, 2011 for related U.S. Appl. No. 11/347,671, 14 pgs.
Kelly, Dylan, Amendment filed in the USPTO dated May 2, 2011 for related U.S. Appl. No. 11/347,671, 6 pgs.
Nguyen, Patricia T., Office Action received from the USPTO dated Oct. 25, 2005 for related U.S. Appl. No. 10/875,405, 7 pgs.
Burgener, et al., Amendment filed in USPTO dated Jan. 25, 2006 for related U.S. Appl. No. 10/875,405, 11 pgs.
Nguyen, Patricia, Office Action received from USPTO dated Apr. 20, 2006 for related U.S. Appl. No. 10/875,405, 10 pgs.
Burgener, et al., Amendment filed in USPTO dated Aug. 21, 2006 for related U.S. Appl. No. 10/875,405, 10 pgs.

(56) References Cited

OTHER PUBLICATIONS

Ngyuen, Patricia, Notice of Allowance received from USPTO dated Sep. 27, 2006 for related U.S. Appl. No. 10/875,405, 6 pgs.
Burgener, et al., Comments on Examiner's Statement of Reasons for Allowance dated Dec. 26, 2006 for related U.S. Appl. No. 10/875,405, 2 pgs.
Le, Lana N., Notice of Allowance received from the USPTO dated Sep. 26, 2005 for related U.S. Appl. No. 11/158,597, 10 pgs.
Le, Lana, International Search Report received from USPTO dated Nov. 15, 2005 for related PCT appln. No. PCT/US2005/022407, 10 pgs.
Le, Lana N., Notice of Allowance received from the USPTO dated Feb. 27, 2006 for related U.S. Appl. No. 11/158,597, 8 pgs.
Dinh, Le T., International Search Report received from USPTO dated Mar. 28, 2003 for related application No. PCT/US02/32266, 3 pgs.
Lauterbach, et al. "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Texas Instruments, "TPS60204, TPS60205, Regulated 3.3-V, 100-mA Low-Ripple Charge Pump Low Power DC/DC Converters", published Feb. 2001, rev. Sep. 2001, pp. 1-18.
Nork, Sam, "New Charge Pumps Offer Low Input and Output Noise" Linear Technology Corporation, Design Notes, Design Note 243, published Nov. 2000, pp. 1-2.
Linear Technology, "LTC1550L/LTC1551L: Low Noise Charge Pump Inverters in MS8 Shrink Cell Phone Designs", published Dec. 1998, pp. 1-2.
Maxim Integrated Products, "Charge Pumps Shine in Portable Designs", published Mar. 15, 2001, pp. 1-16.
Tran, Pablo N., Office Action received from the USPTO dated Mar. 19, 2009 for related U.S. Appl. No. 11/501,125, 17 pgs.
Burgener, et al., Amendment filed in the USPTO dated Jun. 19, 2009 for related U.S. Appl. No. 11/501,125, 5 pgs.
Tran, Pablo N., Office Action received from the USPTO dated Oct. 29, 2009 for related U.S. Appl. No. 11/501,125, 19 pgs.
Lascari, Lance, "Accurate Phase Noise Prediction in PLL Synthesizers" Applied Microwave & Wireless, published May 2000, pp. 90-96.
Burgener, et al., Response (in Japanese) as filed in the Japanese Patent Office for related appln. No. 2007-518298 dated Oct. 15, 2010, 45 pages, plus translation of Response as filed dated Oct. 12, 2010, 10 pages.
Kai, Tetsuo, Translation of an Office Action received from the Japanese Patent Office dated Mar. 29. 2011 for related Japanese appln. No. 2010-232563, 4 pgs.
Chow, Charles Chiang, Office Action received from USPTO for related U.S. Appl. No. 11/347,671 dated Aug. 19, 2008, 14 pgs.
Kelly, Dylan, Amendment filed in the USPTO for related U.S. Appl. No. 11/347,671 dated Dec. 19, 2008, 15 pgs.
Chow, Charles Chiang, Office Action received from USPTO for related U.S. Appl. No. 11/347,671 dated Apr. 16, 2009, 16 pgs.
Kelly, Dylan, Response filed in the USPTO for related U.S. Appl. No. 11/347,671 dated Jun. 16, 2009, 14 pgs.
Chow, Charles Chiang, Office Action received from the USPTO for related U.S. Appl. No. 11/347,671 dated Jul. 20, 2009, 17 pgs.
Kelly, Dylan, Amendment filed in the USPTO for related U.S. Appl. No. 11/347,671 dated Jan. 20, 2010, 18 pgs.
Kelly, Dylan, Amendment filed in the USPTO for related U.S. Appl. No. 11/347,671 dated Jul. 28, 2010, 6 pgs.
Kelly, Dylan, Amendment filed in the USPTO for related U.S. Appl. No. 11/347,671 dated Dec. 20, 2010, 12 pgs.
Chow, Charles Chiang, Office Action received from the USPTO for related U.S. Appl. No. 11/347,671 dated Mar. 2, 2011, 15 pgs.
Chow, Charles Chiang, Advisory Action received from the USPTO for related U.S. Appl. No. 11/347,671 dated May 12, 2011, 3 pgs.
Shifrin, Mitchell, "Monolithic FET Structures for High-Power Control Component Applications", IEEE Transactions on Microwave Theory and Techniques, vol. 37, No. 12, Dec. 1989, pp. 2134-2141.
Kelly, Dylan, Notice of Appeal filed in USPTO dated Jun. 2, 2011 for related U.S. Appl. No. 11/347,671, 6 pgs.
Peregrine Semiconductor Corporation, a Response (in Japanese), dated Aug. 14, 2006, for related Japanese application No. 2003-535287, 6 pgs.
Miyajima, Ikumi, translation of Notice of Reasons for Refusal, dated Oct. 5, 2006 for related Japanese application No. 2003-535287, 4 pgs.
Peregrine Semiconductor Corporation, Response filed in the EPO, dated Dec. 23, 2008 for related application No. 02 800 982.7-2220, 22 pgs.
Pozar, "Microwave and RF Design of Wireless Systems", Wiley, 2001.
Maas, "The RF and Microwave Circuit Design Cookbook", Artech House, 1998.
Smith, "Modern Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Le, Dinh Thanh, Office Action received from the USPTO dated Jun. 23, 2011 for related U.S. Appl. No. 12/803,064, 16 pgs.
Kao, W.H., et al., "Parasitic extraction: current state of the art and future trends", Proceedings of the IEEE, May 2001, vol. 89, Issue 5, pp. 729-739.
Brambilla, A., et al., "Measurements and extractions of parasitic capacitances in ULSI layouts", Electron Devices, IEEE Transactions, Nov. 2003, vol. 50, Iss 11, pp. 2236-2247.
Xu, et al., "An efficient formulation for substrate parasitic extraction accounting for nonuniform current distribution", Circuits and Systems I: Regular papers, IEEE Transactions, Jun. 2004, vol. 51, Issue 6, pp. 1223-1233.
Nabors, et al., "FastCap: A Multipole Accelerated 3-D Capacitance Extraction Program", IEEE Transactions on Computer-Aided Design, vol. 10, No. 11, Nov. 1991, pp. 1447-1459.
Nabors, et al., "Fast Capacitance Extraction of General Three-Dimensional Structures", IEEE Transactions on Microwave Theory and Techniques, vol. 40, No. 7, Jul. 1992, pp. 1496-1506.
Nabors, et al., "Multipole-Accelerated Capacitance Extraction Algorithms for 3-D Structures with Multiple Dielectrics" IEEE Transactions on Circuits and Systems, 1: Fundamental Theory and Applications, vol. 39, No. 11, Nov. 1992, pp. 946-954.
Tausch, et al., "Capacitance Extraction of 3-D Conductor Systems in Dielectric Media with High-Permittivity Ratios", IEEE Transactions on Microwave Theory and Techniques, vol. 47, No. 1, Jan. 1999, pp. 18-26.
Nabors, et al., "A Fast Multipole Algorithm for Capacitance Extraction of Complex 3-D Geometries", IEEE 1989 Custom Integrated Circuits Conference May 1989, pp. 21.7.1-21.7.4.
Nabors, et al., "Fast Capacitance Extraction of General Three-Dimensional Structures", Proc. Int. Conf. on Computer Design, Cambridge, MA, Oct. 1991, pp. 479-484.
Nabors, et al., "Including Conformal Dielectrics in Multipole-Accelerated Three-Dimensional Interconnect Capacitance Extraction" proceedings of NUPAD IV, Seattle, WA, May 1992, pp. 167-172.
Nabors, et al., Multipole-Accelerated 3-D Capacitance Extraction Algorithms for Structures with Conformal Dielectrics Proceeding of the 29th Design Automation Conference, Anaheim, CA, Jun. 1992, pp. 710-715.
Phillips, et al., "A Precorrected-FFT method for Capacitance Extraction of Complicated 3-D Structures" Int. Conf. on Computer-Aided Design, Santa Clara, CA, Nov. 1994, 4 pages.

(56) References Cited

OTHER PUBLICATIONS

Phillips, et al., "Efficient Capacitance Extraction of 3D Structures Using Generalized Pre-Corrected FFT Methods", Proceedings of the IEEE 3rd Topical Meeting on Electrical Performance of Electronic Packaging, Monterey, CA, Nov. 1994, 3 pages.
Cai, et al., Efficient Galerkin Techniques for Multipole-Accelerated Capacitance Extraction of 3-D Structures with Multiple Dielectrics Proceedings of the 16th Conference on Advanced Research in VLSI, Chapel Hill, North Carolina, Mar. 1995, 12 pages.
Kamon, et al., "FastPep: A Fast Parasitic Extraction Program for Complex Three-Dimensional Geometries", Proceedings of the IEEE Conference on Computer-Aided Design, San Jose, Nov. 1997, pp. 456-460.
Englekirk, Robert, Preliminary Amendment filed in the USPTO dated Sep. 11, 2009 for related U.S. Appl. No. 11/796,522, 9 pgs.
Reema, Patel, Office Action received from the USPTO dated Oct. 2, 2009 for related U.S. Appl. No. 11/796,522, 6 pgs.
Englekirk, Robert, Response filed in the USPTO dated Nov. 2, 2009 for related U.S. Appl. No. 11/796,522, 3 pgs.
Shifrin, Mitchell, et al., "Monolithic FET Structures for High-Power Control Component Applications", IEEE Transactions on Microwave Theory and Techniques, vol. 37, No. 12, Dec. 1989, pp. 2134-2141.
Shifrin, Mitchell, et al., "High Power Control Components Using a New Monolithic FET Structure", IEEE 1989, Microwave and Millimeter-Wave Monolithic Circuits Symposium, pp. 51-56.
Volker, Simon, Communication from the European Patent Office for related appln. No. 09174085.2-1233 dated Dec. 3, 2009, 6 pgs.
European Patent Office, Communication Pursuant to Rules 161 and 162 EPC received for related appln. No. 07794407.2 dated Dec. 10, 2009, 2 pgs.
Volker, Simon, European Search Report received from the EPO for related appln. No. 07794407.2 dated Mar. 12, 2010, 8 pgs.
Reema, Patel, Office Action received from the USPTO dated Mar. 2, 2010 for related U.S. Appl. No. 11/796,522, 8 pgs.
Englekirk, Robert, Amendment filed in the USPTO dated Jun. 2, 2010 for related U.S. Appl. No. 11/796,522, 10 pgs.
Volker, Simon, Communication Pursuant to Article 94(3) EPC received from the EPO for related appln. No. 09174085.2 dated May 4, 2010, 1 pg.
Volker, Simon, Communication Pursuant to Article 94(3) EPC received from the EPO for related appln. No. 07794407.2 dated Jun. 15, 2010, 1 pg.
Englekirk, Robert, Response filed in the EPO for related application No. 07794407.2 dated Oct. 20, 2010, 13 pgs.
Englekirk, Robert, Response filed in the EPO for related application No. 09174085.2 dated Oct. 20 2010, 14 pgs.
Reema, Patel, Office Action received from the USPTO dated Aug. 30, 2010 for related U.S. Appl. No. 11/796,522, 15 pgs.
Englekirk, Robert, Amendment filed in the USPTO dated Dec. 30, 2010 for related U.S. Appl. No. 11/796,522, 12 pgs.
Patel, Reema, Notice of Allowance received from the USPTO dated Jan. 28, 2011 for related U.S. Appl. No. 11/796,522, 9 pgs.
Englekirk, Robert, Comments on Examiner's Statement of Reasons for Allowance filed in the USPTO dated Apr. 28, 2011 for related U.S. Appl. No. 11/796,522, 3 pgs.
Young, Lee W., International Search Report and Written Opinion received from the U.S. Receiving Office dated Feb. 15, 2008 for related appln. No. PCT/US2007/010331, 14 pgs.
Copenheaver, Brian, International Search Report and Written Opinion for related appln. No. PCT/US2009/001358 dated May 27, 2009, 11 pages.
Peregrine Semiconductor Corporation, Article 19 Amendment Letter Under Section 205(b) and Rule 46.5(b) PCT filed in WIPO for related appln. No. PCT/US2009/001358, dated Aug. 11, 2009, 12 pages.
Novak, Rodd, "Overcoming the RF Challenges of Multiband Mobile Handset Design", RF/Microwave Switches and Connectors, published Jul. 20, 2007, www.rfdesign.com, 3 pgs.

Qiao, et al., "Antenna Impedance Mismatch Measurement and Correction for Adaptive CDMA Transceivers", Published Jun. 12-17, 2005, by the IEEE in the 2005 Microwave Symposium Digest, 2005 IEEE MTT-S International, pp. 4, et seq.
Sjoblom, Peter, "An Adaptive Impedance Tuning CMOS Circuit for ISM 2.4-GHz Band", Published in the IEEE Transactions on Circuits and Systems—1: Regular Papers, vol. 52, No. 6, pp. 1115-1124, Jun. 2005.
Sjoblom, Peter, "Measured CMOS Switched High-Quality Capacitors in a Reconfigurable Matching Network", IEEE Transactions on Circuits and Systems—II: Express Briefs, vol. 54, No. 10, Oct. 2007, pp. 858-862.
Brosa, Anna-Marie, Extended European Search Report received from the EPO dated Jul. 15, 2011 for related appln. No. 09715932.1, 12 pgs.
Tombak, Ali, et al., "Cellular Antenna Switches for Multimode Applications Based on a Silicon-on-Insulator Technology", 2010 IEEE Radio Frequency Integrated Circuits Symposium, RMO3D-5, pp. 271-274.
Wang, Dawn, et al., High Performance SOI RF Switches for Wireless Applications (Invited Paper), Apr. 2010 IEEE, 4 pgs.
Burgener, Mark L., "CMOS SOS Switches Offer Useful Features, High Integration", Microwaves and RF, Aug. 2001, pp. 107-118.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Madihian, et al., "A 2-V, 1-10GHz BiCMOS Transceiver Chip for Multimode Wireless Communications Networks", IEEE, 1997, pp. 521-525.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Kuo, "Low Voltage SOI CMOS VLSI Devices and Circuits", John Wiley & Sons, Inc., 2001.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., "SOI CMOS Device Having Body Extension for Providing Sidewall Channel Stop and Bodytie", U.S. Statutory Invention Registration No. H1435, published May 2, 1995, 12 pgs.
Tieu, Binh Kien, Notice of Allowance received from the USPTO for related U.S. Appl. No. 12/315,395, dated Aug. 11, 2010, 26 pgs.

(56) References Cited

OTHER PUBLICATIONS

Tieu, Binh Kien, Supplemental Notice of Allowance received from the USPTO for related U.S. Appl. No. 12/315,395, dated Oct. 29, 2010, 10 pgs.
Kelly, et al., Comments on Examiner's Statement of Reasons for Allowance filed in the USPTO for related U.S. Appl. No. 11/347,014, dated Jul. 29, 2010, 2 pgs.
Raab, et al., "Power Amplifiers and Transmitters for RF and Microwave", IEEE Transactions on Microwave Theory and Techniques, vol. 50, No. 3, pp. 814-826, Mar. 2002, USA.
Ueda, et al., "A 5GHz-Band On-Chip Matching CMOS MMIC Front-End", 11th GAAS Symposium—Munich 2003, pp. 101-104, Germany.
Nelson Pass, Pass Labs, "Cascode Amp Design", Audio Electronics, pp. 1-4, Mar. 1978.
Lester F. Eastman, P.I., "High Power, Broadband, Linear, Solid State Amplifier", 16th Quarterly Rep. under MURI Contract No. N00014-96-1-1223 for period Jun. 1, 2000-Aug. 31, 2000, Sep. 2000.
Jeon, et al., "A New "Active" Predistorter with High Gain Using Cascode-FET Structures", IEEE Radio Frequency Integrated Circuits Symposium, 2002, pp. 253-256.
Hsu, et al., "Comparison of Conventional and Thermally-Stable Cascode (TSC) AlGaAs/GaAs HBTs for Microwave Power Applications", Jml of Solid-State Electronics, V. 43, Sep. 1999.
Kim, et al., "High-Performance V-Band Cascode HEMT Mixer and Downconverter Module", IEEE Transactions on Microwave Theory and Techniques, vol. 51, No. 3, p. 805-810, Mar. 2003.
Peregrine Semiconductor Corporation, Response filed in the EPO, dated Oct. 7, 2009 for related application No. 02 800 982.7-2220, 23 pgs.
Theunissen, Lars, Communication under Rule 71(3) EPC received from the EPO dated Oct. 2, 2017, for appln. No. 14165804.7, 94 pgs.
Puentes, Daniel Calrissian, Office Action received from the USPTO dated Nov. 22, 2017 for U.S. Appl. No. 15/442,491, 19 pgs.
Dang, Hung Q., Office Action received from the USPTO dated Oct. 14, 2016 for U.S. Appl. No. 14/638,917, 19 pgs.
Patel, Reema, Notice of Allowance received from the USPTO dated Nov. 2, 2016 for U.S. Appl. No. 14/883,122, 14 pgs.
Ranta, et al., Response filed in the USPTO dated Nov. 7, 2016 for U.S. Appl. No. 14/814,404, 8 pgs.
Reedy, et al., Response filed in the USPTO dated Sep. 29, 2016 for U.S. Appl. No. 14/883,512, 16 pgs.
Reedy, et al., Response to Final Office filed in the USPTO dated Jun. 15, 2017 for U.S. Appl. No. 14/883,512, 15 pgs.
Willoughby, Terrence Ronique, Notice of Allowance received from the USPTO dated Jul. 26, 2017 for U.S. Appl. No. 14/883,512, 5 pgs.
Peregrine Semiconductor Corporation, Response filed in the USPTO dated Apr. 11, 2016 for U.S. Appl. No. 14/165,422, 5 pgs.
Puentes, Daniel Calrissian, Office Action received from the USPTO dated May 10, 2016 for U.S. Appl. No. 14/814,404, 8 pgs.
Patel, Reema, Office Action received from the USPTO dated Jun. 22, 2016 for U.S. Appl. No. 14/883,122, 8 pgs.
Le, Dinh Thanh, Notice of Allowance received from the USPTO dated Jun. 29, 2016 for U.S. Appl. No. 14/165,422, 24 pgs.
Willoughby, Terrence Ronique, Office Action received from the USPTO dated Jun. 29, 2016 for U.S. Appl. No. 14/883,512, 10 pgs.
Patel, Reema, Office Action received from the USPTO dated Aug. 15, 2014 for U.S. Appl. No. 14/028,357, 8 pgs.
Patel, Reema, Final Office Action received from the USPTO dated Apr. 7, 2015 for U.S. Appl. No. 14/028,357, 159 pgs.
Patel, Reema, Notice of Allowance received from the USPTO dated Jun. 25, 2015 for U.S. Appl. No. 14/028,357, 12 pgs.
Englekrik, Robert Mark, Response filed in the USPTO dated Dec. 15, 2014 for U.S. Appl. No. 14/028,357, 10 pgs.
Englekrik, Robert Mark, Response After Final Office Action filed in the USPTO dated Jun. 8, 2015 U.S. Appl. No. 14/028,357, 3 pgs.

Willoughby, Terrence Roniquie, Final Office Action received from the USPTO dated May 19, 2017 for U.S. Appl. No. 14/883,512, 38 pgs.
Brosa, Anna-Maria, Communication pursuant to Article 94(3) EPC received from the EPO dated Mar. 20, 2017 for appln. No. 14165804.7, 6 pgs.
Puentes, Daniel Calrissian, Notice of Allowance received from the USPTO dated May 3, 2017 for U.S. Appl. No. 14/814,404, 29 pgs.
Meulemans, et al., Communication under Rule 71(3) EPC received from the EPO dated Dec. 13, 2016 for appln. No. 07794407.2, 33 pgs.
Meulemans, et al., Communication under Rule 71(3) EPC received from the EPO dated Dec. 13, 2016 for appln. No. 09174085.2, 30 pgs.
Ranta, Tero Tapio, Response filed in the USPTO dated Jan. 16, 2017 for U.S. Appl. No. 14/638,917, 12 pgs.
Puentes, Daniel Calrissian, Office Action received from the USPTO dated Feb. 1, 2017 for U.S. Appl. No. 14/814,404, 13 pgs.
Dang, Hung, Notice of Allowance received from the USPTO dated Feb. 13, 2017 for U.S. Appl. No. 14/638,917, 13 pgs.
Ranta, et al., Response filed in the USPTO dated Feb. 24, 2017 for U.S. Appl. No. 14/814,404, 4 pgs.
Tadashige, Itoh, et al, Office Action and English translation received from the JPO dated Feb. 7, 2017 for appln. No. 2015-225020, 10 pgs.
Ichikawa, Takenori, Office Action and English translation received from the JPO dated Aug. 1, 2015 for appln. No. 2013-181032, 15 pgs.
Ranta, et al., Response filed in the USPTO dated Nov. 6, 2015 for U.S. Appl. No. 14/165,422, 2 pgs.
Wong, Alan, Notice of Allowance received from the USPTO dated Dec. 18, 2015 for U.S. Appl. No. 13/586,738, 21 pgs.
Le, Dinh Thanh, Office Action received from the USPTO dated Jan. 11, 2016 for U.S. Appl. No. 14/165,422, 47 pgs.
Henderson, Richard, Summons to Attend Oral Proceedings pursuant to Rule 115(1) received from the EPO dated Jun. 30, 2020 for appln. No. 18157696.8, 11 pgs.
Tieu, Binh Kien, Final Office Action received from the USPTO dated Jan. 17, 2006 for U.S. Appl. No. 10/922,135, 8 pgs.
Weman, Eva, Communication under Rule 71(3) EPC received from the EPO dated Nov. 27, 2009 for appln. No. 02800982.7, 68 pgs.
Aquilani, Dario, Communication and Supplementary European Search Report dated Nov. 27, 2009 for appln. No. 05763216, 10 pgs.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 245 GHz Wireless Commercial Products", Microwave and Millimeter-Wave Monolithic Circuits Symposium, 1994, pp. 15-18.
Assaderaghi, et al., "Dynamic Threshold Voltage MOSFET (DTMOS) for Ultra Low Voltage VLSI", IEEE Transactions on Electron Devices, vol. 44, No. 3, Mar. 1997, pp. 414-422.
Bolam, et al., "Reliability Issues for Silicon-on-Insulator", IBM Micro Electronics Division, IEEE 2000, pp. 6.4.1-6.4.4.
Caverly, et al., "CMOS RF Circuits for Integrated Wireless Systems", IEEE, 1998, pp. 1-4.
Chao, et al., "High-Voltage and High-Temperature Applications of DTMOS with Reverse Schottky Barrier on Substrate Contacts", vol. 25, No. 2, Feb. 2004, pp. 86-88.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSFETs on SOI: An Experimental Comparison with Bulk Si MOSFETs", IEEE Radio Frequency Integrated Circuits Symposium, 2001, pp. 43-46.
Giffard, et al., "Dynamic Effects in SOI MOSFETs", IEEE SOS/SOI Technology Conference, Oct. 1991, pp. 160-161.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODFETs", IEEE, 1997, pp. 669-672.

(56) References Cited

OTHER PUBLICATIONS

Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, et al. "Effect of Body Structure on Analog Performance of SOI NMOSFETs", 1998 IEEE International SOI Conference, Oct. 1998, pp. 61-62.
Lee, "CMOS RF: (Still) No Longer an Oxymoron (Invited)", IEEE Radio Frequency Integrated Circuits Symposium, 1999, pp. 3-6.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Niishijima, et al., "A High Performance Transceiver Hybrid IC for PHS Hand Set Operating with Single Positive Voltage Supply", Microwave Symposium Digest, 1997, pp. 1155-1158.
O, et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.
Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.
Uda, et al., "A High Performance and Miniturized Dual Use (antenna/local) GaAs SPDT Switch IC Operating at +3V/0V", Microwave Symposium Digest, 1996, pp. 141-144.
Ranta, et al., Comments on Examiner's Statement of Reasons for Allowance filed in the PTO dated Sep. 10, 2012 for related U.S. Appl. No. 12/803,133, 3 pgs.
Ranta, et al., Amendment filed in the PTO dated Sep. 12, 2012 for related U.S. Appl. No. 12/803,064, 13 pgs.
Shimura, et al., "High Isolation V-Band SPDT Switch MMIC for High Power Use", 2001 IEEE MTT-S Digest, pp. 245-248.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Park, Jooyoun, "A Regulated, Charge-Pump CMOS DC/DC Converter for Low-Power Applications", Massachusetts Institute of Technology, Apr. 1, 2998, 62 pgs.
Barker, Communications Electronics-Systems, Circuits, and Devices, 1987, Prentice-Hall.
Carr, "Secrets of RF Circuit Design", McGraw-Hill, 1997.
Couch, "Digital and Analog Communication Systems", 2001, Prentice-Hall.
Couch, "Modern Telecommunication System", Prentice-Hall, 1995.
Freeman, "Radio System Design for Telecommunications", Wiley, 1997.

\* cited by examiner

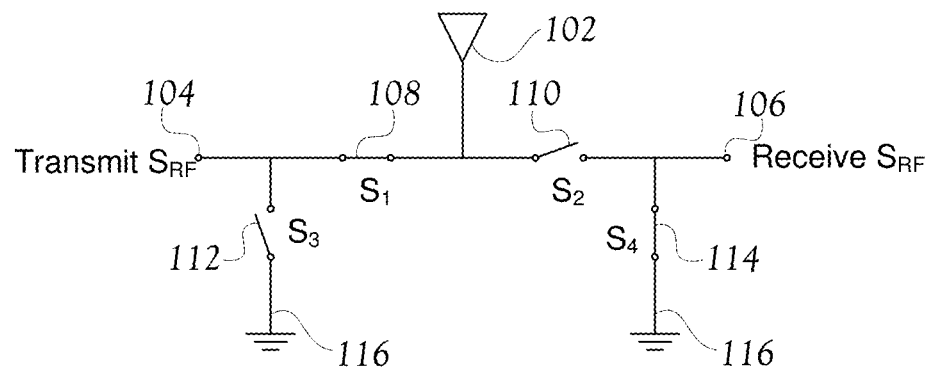
FIG. 1
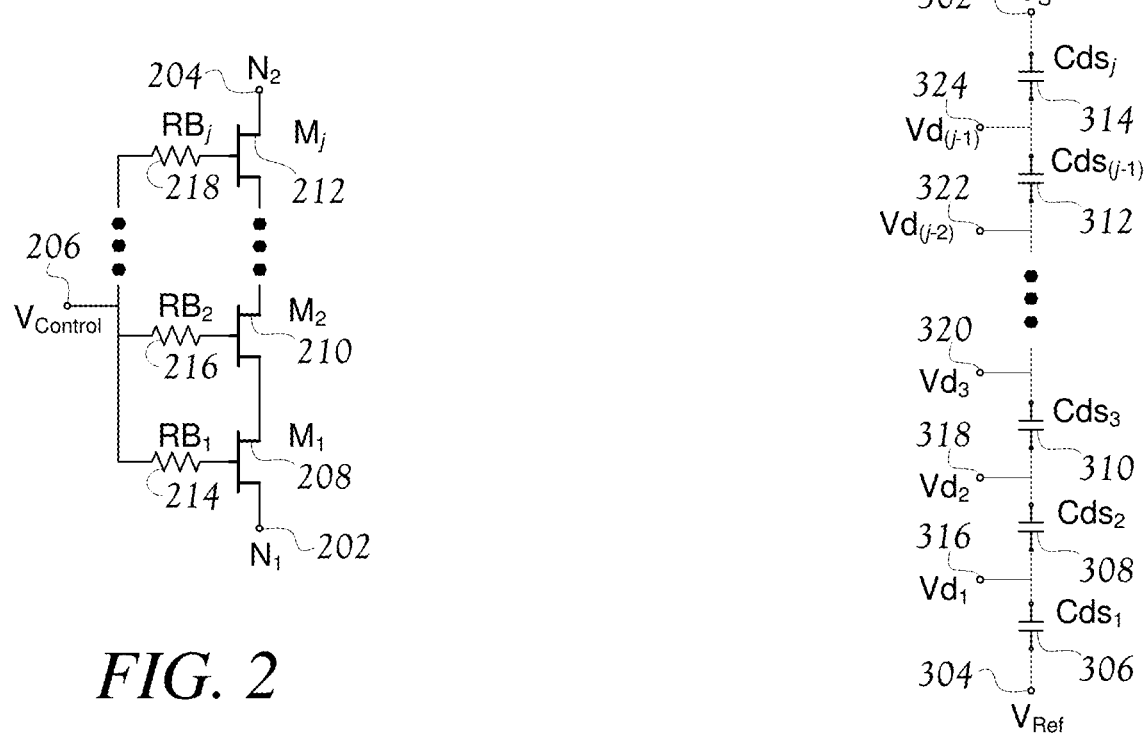
FIG. 2
FIG. 3

TUNING CAPACITANCE TO ENHANCE FET STACK VOLTAGE WITHSTAND

CROSS-REFERENCE TO RELATED APPLICATIONS—CLAIMS OF PRIORITY

This application is a continuation application of co-pending and commonly assigned U.S. application Ser. No. 15/829,773, "Tuning Capacitance to Enhance FET Stack Voltage Withstand", filed Dec. 1, 2017; application Ser. No. 15/829,773 is a continuation application of commonly assigned U.S. application Ser. No. 15/061,909, "Tuning Capacitance to Enhance FET Stack Voltage Withstand", filed Mar. 4, 2016, now U.S. Pat. No. 9,866,212, issued Jan. 9, 2018; application Ser. No. 15/061,909 is a continuation application of commonly assigned U.S. application Ser. No. 14/883,122, "Tuning Capacitance to Enhance FET Stack Voltage Withstand", filed Oct. 14, 2015, now U.S. Pat. No. 9,595,956 issued Mar. 14, 2017; application Ser. No. 14/883, 122 is a continuation application of commonly assigned U.S. application Ser. No. 14/028,357, "Tuning Capacitance to Enhance FET Stack Voltage Withstand", filed Sep. 16, 2013, now U.S. Pat. No. 9,177,737 issued Nov. 3, 2015, which is a continuation application of commonly assigned U.S. application Ser. No. 13/046,560, "Tuning Capacitance to Enhance FET Stack Voltage Withstand", filed Mar. 11, 2011, Issued as U.S. Pat. No. 8,536,636 on Sep. 17, 2013, which is a divisional application of issued and commonly owned U.S. application Ser. No. 11/796,522, filed Apr. 26, 2007, issued Jun. 14, 2011 as U.S. Pat. No. 7,960,772 and entitled "Tuning Capacitance to Enhance FET Stack Voltage Withstand", and the contents of the above cited pending application and issued patents are hereby incorporated by reference herein in their entirety.

BACKGROUND

1. Field

The present disclosure relates to electronic integrated circuits ("ICs"), and more specifically to circuits comprised of stacked transistor devices for switching high frequency signals.

2. Related Art

Most radios, cell phones, TVs, and related equipment today require an "RF switch" to control connections between various transmitter and receiver circuits ("RF" is used generically herein to mean any reasonably high frequency ac signal). FIG. 1 is a simplified schematic diagram of a typical, simple two throw switch that may by used to switch, for example, a single antenna 102 between a transmit signal source 104 and a receive circuit 106. Switches $S_1$ 108, $S_2$ 110, $S_3$ 112 and $S_4$ 114 are represented by a mechanical single pole single throw switch symbol. Typically, the switches are controlled such that when $S_1$ is "closed" or conducting at low impedance, $S_2$ is "open" or high impedance. Because no switch is perfect, the node of a transmit/receive switch (such as $S_1$ 108 or $S_2$ 110) farthest from the antenna is typically shunted to circuit common to reduce the effects of signal leakage through such switch when it is open. Thus, as $S_2$ 110 is illustrated in the "open" state, the corresponding shunt switch $S_4$ 114 is "closed" to terminate the Receive $S_{RF}$ signal on node 106 to ground 116. Conversely, the shunt switch $S_3$ 112 is "open" condition because its corresponding signal switch $S_1$ 108 is "closed" to conduct the Transmit $S_{RF}$ signal on node 104 to the antenna 102. To couple the antenna 102 to the receive circuit, the condition of all four switches would typically be inverted to that shown in FIG. 1.

In modern circuits, RF switches such as represented in FIG. 1 are most often implemented using semiconductor devices, typically some form of field effect transistor (FET). Semiconductor RF switches are commonly fabricated using insulated gate FETs, often generically called MOSFETs despite the fact that many do not employ the original metal/oxide/semiconductor construction that gave rise to that acronym. Non-insulating gate FETs, such as junction FETs (JFETs), are also commonly used, particularly with certain semiconductor materials such as GaAs. Each switch may be implemented using a single FET, or, as described herein, a multiplicity of FETs stacked in series.

The impedance of ON (conducting) switches is generally sufficiently low that the voltage developed across it in this condition is negligible. However, switches that are OFF (nonconducting, or high impedance) must typically support the full voltage of the RF signal they control. Thus, the RF power that can be controlled by a semiconductor RF switch depends on its voltage withstand capacity, which in turn depends on the drain-to-source breakdown voltage (BVds) of its constituent transistor(s). In FIG. 1, both $S_2$ 110 and $S_3$ 112 must withstand the transmit signal voltage $S_{RF}$ with respect to ground.

Integrated circuit fabrication requires many compromises. In particular, many IC transistors that are otherwise highly effective for switching RF signals have a modest BVds, and thus may be inadequate to control signals of substantial amplitude. One solution may be to employ alternative transistor designs yielding higher BVds. However, the tradeoffs necessary to fabricate transistors with higher BVds in an integrated circuit may be burdensome. For example, such design may be incompatible with other circuitry desired for the integrated circuit, or it may otherwise be uneconomical.

Therefore, many semiconductor RF switches today stack a multiplicity of low BVds transistors in series to improve the breakdown performance of the overall switch. FIG. 2 represents an example of such a stacked-transistor semiconductor switch. The switch is disposed between a first node $N_1$ 202 and a second node $N_2$ 204, and is controlled by a voltage $V_{Control}$ 206. To form the overall switch, a multiplicity j of FETs are "stacked" in series connection, from drain to adjacent source. Thus, a first transistor $M_1$ has a source coupled to $N_1$ 202, and a drain coupled directly to the source of a second FET $M_2$ 210. Additional FETs, represented by a series of dots, may be similarly connected above $M_2$ 210, the drain of the last such intervening FET being coupled to the source of the top or $j^{th}$ FET of the stack, FET $M_j$ 212. Each FET of the stack is controlled by $V_{Control}$ as coupled to the FET's gate via a corresponding gate impedance, such as the base resistances $RB_1$ 214, $RB_1$ 216, . . . , $RB_j$ 218 that are illustrated.

Though the FET channel terminal closer to $N_1$ is referred to as the "source," and the opposite terminal as the "drain," this is not a requirement. FETs may be implemented in a wide variety of designs and polarities (e.g., N channel FETs and P channel FETs; enhancement and depletion modes, and various threshold voltages, etc.). Moreover, the circuits in which transistors are employed may be illustrated using different conventions than are followed herein. Transistor polarity and drain-source orientation may often be interchanged without significantly altering the principle of operation of a circuit. Rather than illustrate the numerous possible permutations of drawing conventions, transistor polarities, and transistor designs, it should be well understood by those skilled in the electronics arts that the exemplary description and figures illustrated herein equally represent all such alternative circuit descriptions and equivalent device designs.

For most RF switch purposes, base impedances (represented in FIG. 2 as resistors $RB_x$ 214, 216, 218) should combine with the effective corresponding gate capacitance of the FET to form a low-pass filter whose transfer function has at least a single pole roll-off at a frequency that is less than 1/6 the lowest (expected) design frequency for the signal that will exist between $N_1$ and $N_2$. Indeed, the at least one pole frequency is preferably 1/10 such lowest design signal frequency, or even lower. Such low frequency base control permits the gate voltage of each FET to follow the voltage on the channel of the FET, thus assuring the correct "on" or "off" gate/source voltage (Vgs), and also limiting both Vgs and the drain/gate voltage (Vdg) to prevent breakdown of the gate insulation.

Ideally, stacked device switches such as shown in FIG. 2 have a net voltage withstand capacity equal to BVds of the individual FETs, multiplied by the number (j) of FETs in the stack. Thus, a stack of 10 transistors each having BVds of 1.8 V would ideally be capable of switching a signal having a peak amplitude of 18 V. In practice, unfortunately, such stacks may be unable to support such ideal voltage. The voltage withstand capacity can be increased by increasing the number of devices in the stack, but this may cause large increases in the corresponding required integrated circuit area.

For example, assume that BVds for a given fabrication process is 2V (i.e., each single transistor can handle 2V), but that a 16V signal must be controlled. A stack of eight transistors should ideally be able to control a signal of peak amplitude 16V. If eight transistors prove insufficient for this task in practice, then more transistors must be added to support the required voltage. Unfortunately, the series resistance of the stack is the sum of the individual device resistances. Consequently, as the number of stacked devices increases by a factor S, so does the ON resistance of the switch. Therefore, to maintain the required overall ON resistance (or insertion loss), the impedance of each device must be reduced by the factor S. This, in turn, requires that the area of each such device is increased by the factor S. Given S additional FETs, each with an area increased by S, it is clear that the total area of the FETs in the stack will increase as $S^2$. At some point, the switch area can be immense. Moreover, the parasitic capacitances of these transistors typically increase with the area, and this can lead to numerous additional problems.

Thus, there is clearly a need to identify and solve the problem that prevents some stacked FETs from controlling the ideal voltage, i.e., the number of FETs times the BVds of the individual FETs. Embodiments of devices and methods of manufacturing such devices are described herein that can mitigate or eliminate the noted problem, thus enabling stacked transistors to withstand voltages that approach, or even equal, the theoretical maximum for a given BVds of the constituent transistors.

SUMMARY

Research into observed failures of some stacked transistor RF switches at lower than expected applied switch voltages (Vsw) led to a conclusion that small parasitic capacitances (Cpd), previously thought negligible, were unexpectedly causing significant imbalances in the distribution of Vsw across the individual transistors of the stack. To reduce the distribution imbalances, capacitance to internal stack nodes is added or intentionally modified, in contrast to the previous practice of merely making drain-source capacitances (Cds) uniform for the series-connected (stacked) transistors.

One embodiment is a stacked transistor RF switch comprising a multiplicity of constituent transistors (e.g., FETs) of the stack all coupled in series connection drain to source to form a series string for which internal nodes are those between adjacent transistors. This embodiment includes effective drain-source capacitance Cds that is significantly different for one transistor than for another transistor of the stack. Their relative Cds values may differ by an amount of at least 2%, 5%, or 10%, or by at least 0.5% between each of a majority of pairs of constituent transistors, and/or so as to effectively tune capacitances of the stack. Tuning is effective if a variance of the magnitude of Vds-off as distributed across all constituent transistors increases when the Cds values are made substantially more equal. An embodiment may include a discrete capacitive element coupled to an internal node of the series string, and/or may include transistors having different Cds values due to design differences, and may have different Cds between a majority of pairs of transistors of the stack.

Another embodiment is also a stacked transistor RF switch comprising a multiplicity of constituent transistors (e.g., FETs) of the stack all coupled in series connection drain to source to form a series string for which internal nodes are those between adjacent transistors. This embodiment includes a discrete physical capacitor element Ccomp that effectively tunes capacitances of the transistor stack by being coupled to an internal node of the series string. Tuning is effective if a variance of the magnitude of Vds-off as distributed across all constituent transistors increases when all Ccomp capacitor elements are removed. Ccomp capacitors may be fabricated as metal-insulator-metal (MIM) capacitors, or may be any other distinct physical feature having an impedance that is predominantly capacitive at the frequency (a primary frequency) of a signal ordinarily switched by the RF switch.

A further embodiment is a method of fabricating an RF switch comprising a multiplicity of series connected constituent transistors in a series string for which internal nodes are those between each pair of adjacent transistors, and includes a step of establishing significantly different values for total effective drain-source capacitance Cds of different transistors in the stack. Significantly different values may be those varying by at least 2%, 5%, or 10%, or by at least 0.5% between each of a majority of pairs of constituent transistors, and/or may be such as to effectively tune capacitances of the stack. Tuning is effective if a variance of Vds-off as distributed across all constituent transistors due to a voltage Vsw applied across the RF switch would increase if the effective drain-source capacitances were substantially more equal. The method may include an additional step of determining parasitic drain capacitances, other than drain-source capacitances, coupled to internal nodes in the series string, and may include a further step of determining voltages of nodes to which the parasitic drain capacitances are coupled as compared to voltages on endnodes of the RF switch. The method may include a further capacitance balancing step of establishing values of the capacitances coupled to a particular internal node of the series string of stacked transistors and multiplying each such capacitance value by a number reflecting a proportion of Vsw appearing across the capacitance in operation to voltage-weight the capacitance, such that a sum of such voltage-weighted capacitances is approximately zero for the particular node. The method may further include thus balancing a node between each of a majority of adjacent transistor pairs, or even thus balancing a node between each adjacent transistor pair of the stack.

A yet further embodiment is a method of fabricating an RF switch comprising a multiplicity of series connected constituent transistors in a series string for which internal nodes are those between each pair of adjacent transistors, and includes a step of coupling a discrete capacitive feature, or alternatively at least two discrete capacitive features, to one or more internal nodes of the stack. A discrete capacitive feature is a distinct element having an impedance that is predominantly capacitive at the frequency of a signal that is ordinarily switched by the RF switch, and the added capacitive feature(s) may be required to effectively tune capacitances of the stack, such that a variance of magnitude in Vds-off as distributed across all constituent transistors due to an RF switch voltage Vsw applied across the RF switch increases when all such discrete capacitive features are omitted. The method may include an additional step of determining parasitic drain capacitances Cpd that are coupled to an internal node in the series string, and also may include determining voltages of nodes to which the parasitic drain capacitances are coupled as compared to voltages on endnodes of the RF switch. The step of determining parasitic drain capacitances may include analyzing semiconductor device layout geometric parameters including parameters descriptive of interconnection traces. The method may include a capacitance balancing step of weighting each value of the capacitances coupled to a particular internal node of the series string of stacked transistors according to a number reflecting a proportion of Vsw appearing across the capacitance in operation, such that a sum of such weighted capacitance values is approximately zero for the particular node. The method may further include performing the balancing step for each of a majority of the internal nodes of the series string, or for all of the internal nodes of the series string.

BRIEF DESCRIPTION OF THE DRAWINGS

Embodiments of the present invention will be more readily understood by reference to the following figures, in which like reference numbers and designations indicate like elements.

FIG. 1 is a simplified schematic diagram of a simple transmit/receive RF switch.

FIG. 2 illustrates a basic FET stack designed to function as an RF switch device.

FIG. 3 illustrates voltage division across j stacked FETs in an RF switch that is "off."

DETAILED DESCRIPTION

Figure 4:
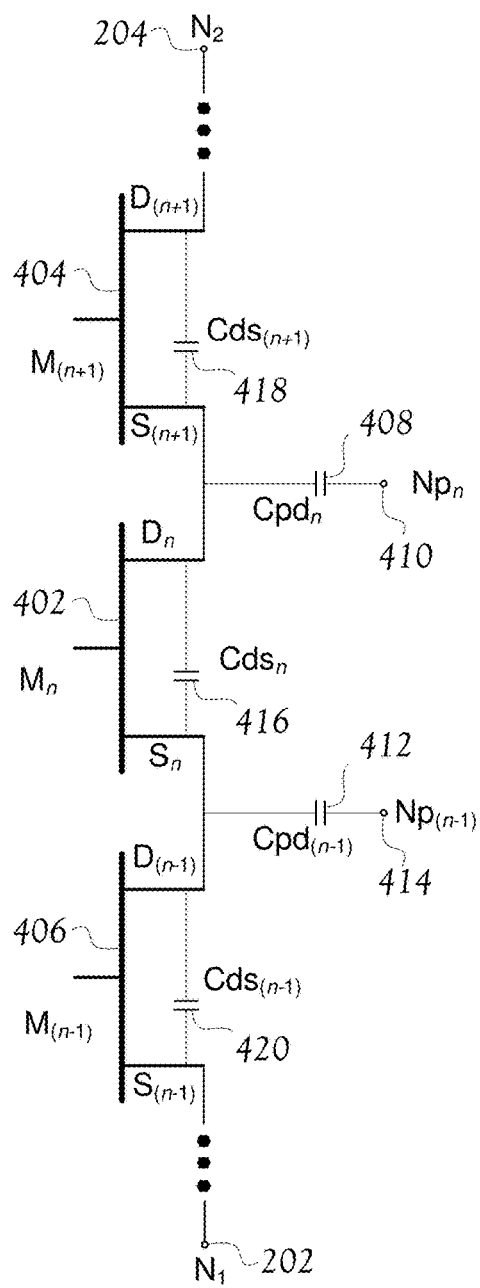
FIG. 4 illustrates effective parasitic drain capacitances Cpd for FETs in a stack such as illustrated in FIG. 2.

The background set forth above describes a typical stacked RF switch, as illustrated in FIG. 2. FIG. 3 illustrates how a switch such as shown in FIG. 2 should divide an applied RF voltage, such as ($V_s$ 302-$V_{Ref}$ 304) such that equal voltages are imposed on each of the j FETs in the stack. When the switch is off (and presuming $V_{Ref}$ is zero), $V_S$ 302 is applied to the endnodes 302-304 of the stack. Though each FET is in a high impedance state, the switch conducts somewhat due to the effective drain-source capacitances $Cds_x$ corresponding to each $FET_x$. Because the "off" conduction is almost entirely due to these capacitances, the FET structure itself is not shown, but only the j corresponding effective drain-source capacitances $Cds_1$ 306, $Cds_2$ 308, $Cds_3$ 310, . . ., $Cds_{(j-1)}$ 312 and $Cds_j$ 314. This capacitive divider distributes the impressed voltage $V_S$ across each corresponding drain node to produce $Vd_1$ 316, $Vd_2$ 318, $Vd_3$ 320, . . ., $Vd_{(j-2)}$ 322 and $Vd_{(j-1)}$ 324.

If each Cds has the same value, it appears that $V_S$ should divide uniformly across the FETs such that $Vd_1$ (all voltages with respect to $V_{Ref}$) is $V_s/j$, $Vd_2$ is $2*V_s/j$, and so on, with $Vd_{(j-1)}=(j-1)V_s/j$. Because of this expected result, stacked FET devices have previously been fabricated to establish Cds for each FET at substantially the same value. Other parasitic capacitances in such FET stacks are generally quite small relative to Cds, and moreover typically do not directly divide the impressed voltage. Accordingly, the effects of such other parasitic capacitances have been largely ignored in regard to voltage division across the FETs in stacked-FET RF switches.

The series coupling of transistors to form a stacked switch as represented, for example, in FIG. 2 forms a path for conduction when the switch is "on." In that "on" condition, the conduction path couples together the endnodes ($N_1$ 202 on the "bottom" and $N_2$ 204 on the "top") via the channels of all of the constituent FETs $M_1$ 208 to $M_j$ 212. Only nodes along such conduction path will be referred to herein as "series nodes" or "nodes of the series string" of a transistor stack or stacked switch. Typically, most of the series string nodes are either a drain or a source of a constituent FET, which are so closely coupled that all such nodes may be called "drain nodes." However, other elements may be disposed in the series string of a transistor stack, and if so may have nodes that are on the conduction path, and that are therefore also "series nodes" or "nodes of the series string."

Voltage Distribution Inequality Due to Parasitic Drain Capacitances

After examination of a problem of unexpectedly low voltage breakdown for stacked-FET RF switches, the Applicant determined that voltage distribution across the FETs in such stack was not uniform. Therefore one FET generally experienced a larger proportion of the total applied switch voltage than any other FET in the stack. That most heavily stressed FET failed first, leading to failure of the other FETs in a domino-like effect. Upon further investigation, the Applicant determined that the voltage distribution inequalities are often caused by parasitic capacitances that are small compared to the drain-source capacitances, and hence have been previously overlooked.

As noted above, drain parasitic capacitance (Cpd) values are generally not more than a few percent of the corresponding drain-source capacitance Cds. As such, Cpd has often been ignored when calculating the expected voltage distribution. Even small values of Cpd, however, may have large effects on the voltage distribution, depending upon the node to which such Cpd is coupled. A Cpd coupling a drain to a node Np that experiences some combination of the signals at the RF switch endnodes may inject such signals into the drain, changing the distribution of voltages across the FETs of the stack from the ideal equality to something less desirable. That is, if the node Np experiences a signal that comprises $(A^*V_1+B^*V_2)$, where A and B are possibly complex or even time-varying multipliers, $V_1$ is the voltage at one end of the "open" RF switch, and $V_2$ is the voltage at the other end of the open RF switch, then a signal will be injected into the corresponding drain that distorts the distribution of $(V_2-V_1)$ across the FETs. Any Cpd that couples to such an Np (a node having a significant component of $(A^*V+B^*V_2)$) may be relevant to net voltage distribution. When the signal on such Np differs greatly from the "ideal" drain voltage, the signal injection and resulting voltage distribution inequality can be quite substantial, even if Cpd is small, due to the large voltage across it. This effect is described in more detail below with reference to FIG. 4.

Not all integrated circuit technologies have been equally successful in enhancing RF switch breakdown voltage by stacking devices in series. In some technologies, Cpd may be quite obviously significant in comparison with a corresponding Cds, and hence would not be overlooked. However, the problem has also not been recognized or resolved with these technologies, possibly because the performance has been so bad that the issue has not been pursued. Indeed, the very large parasitic components might possibly be an important reason that stacked switch designs have not been pursued using some integrated circuit technologies.

Special case: parasitic drain capacitances Cpd are predominantly disposed between a corresponding drain and ground. In a special case, each significant $Cpd_n$, for $1<=n<=(j-1)$, is coupled to a common voltage $V_{COM}$ (e.g., ground) to which one end of the corresponding RF switch is connected. Stated differently, each $Np_n$ experiences essentially the same signal as does one end of the RF switch, typically $V_{COM}$ or ground. This special case is addressed first for two reasons: first, it approximates many practical switches; and second, it is conceptually simple.

An RF switch is often disposed between an RF signal node and a ground or circuit common node. This is the situation, for example, for RF switch $S_3$ 112 of the transmit/receive antenna switch circuit illustrated in FIG. 1. As shown in FIG. 1, the transmit RF signal Transmit $S_{RF}$ 104 is imposed on one side of $S_3$ 112, while the other side of the switch $S_3$ is connected to ground 116. It is also not unusual for parasitic drain capacitances Cpd to be predominantly coupled to a ground plane. For example, Cpd may predominantly consist of parasitic capacitances to a substrate, and such substrate may be held at ground potential (at least for RF purposes). At least when both of these conditions exist, the special case arises in which each relevant Cpd is coupled to the signal at one end of the RF switch. In such special case, the Cpd of each FET will have an effect on the (off) RF switch voltage distribution that is roughly proportional to the value of such Cpd multiplied by the number n of the FET, where n=1 for the FET whose source is coupled to $V_{COM}$ or ground, such that n indicates how many FETs are connected in series between the drain of $FET_n$ and $V_{COM}$ or ground.

FIG. 4 illustrates three FETs 402, 404 and 406 within a stack of j FETs that are disposed between a first node $N_1$ 202 and a second node $N_2$ 204. For purposes of understanding the special case, it is temporarily assumed that $N_1$ 202 is ground, and that $Np_n$ 410 and $Np_{(n-1)}$ 414 are also coupled to ground for at least RF signals. It is also presumed that the ideal voltage on $D_n$ (the drain of the center FET $M_n$ 402) is $(n/j)V_{N2}$. Such ideal voltage distribution obtains in the RF switch reflected by FIG. 4 if, for example, all values Cds are equal, and all values of Cpd are truly negligible. It is also momentarily assumed that all values of Cds are indeed equal, and further that all values of $Cpd_x$, for x unequal to n, are truly negligible.

Figure 5:
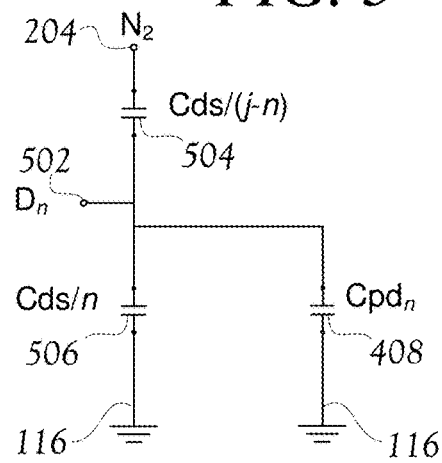
FIG. 5 is an equivalent circuit illustrating effects of a parasitic drain capacitance Cpd.

The effect of $Cpd_n$ 408 on the signal present on the drain $D_n$ 502 of $FET_n$ may then be analyzed with reference to FIG. 5, which is an equivalent circuit for FIG. 4 that reflects the conditions and assumptions noted above. The equal-valued Cds capacitances for the (j−n) FETs above FET $M_n$ are equivalent to a capacitor 504 having a value of Cds/(j−n). Similarly, the Cds for the lowest n FETs are equivalent to a capacitor 506 having a value Cds/n. As noted above, Cpd values have conventionally been ignored because they are generally not more than about 2% of the values of Cds. Consideration of FIG. 5 reveals, however, that the effect of $Cpd_n$ is much greater than suggested by its size in proportion to Cds, at least when n approaches j for large stacks. For example, let j=16, n=15, and $Cpd_n$ =2% of Cds. Though $Cpd_n$ is only 2% as large as Cds, it is 30% as large as the equivalent capacitor (capacitor 506) that is parallel to $Cpd_n$; as such, $Cpd_n$ is clearly not negligible. In fact, the resulting voltage at $D_n$ 502 becomes $(0.9202)N_2$, rather than the ideal value (were $Cpd_n$ not present) of $(15/16)N_2$ or $(0.9375)N_2$. Just a single $Cpd_{15}$, having a value only 2% that of Cds, thus causes the drain-source voltage across $M_{16}$ to be $(1.276/16) N_2$ rather than $(1/16)N_2$, which is a 27.6% increase in $Vds_{16}$. Moreover, the effect is greatly increased when each $D_n$ has a corresponding $Cpd_n$ to ground, as illustrated in FIG. 7.

Figure 7:
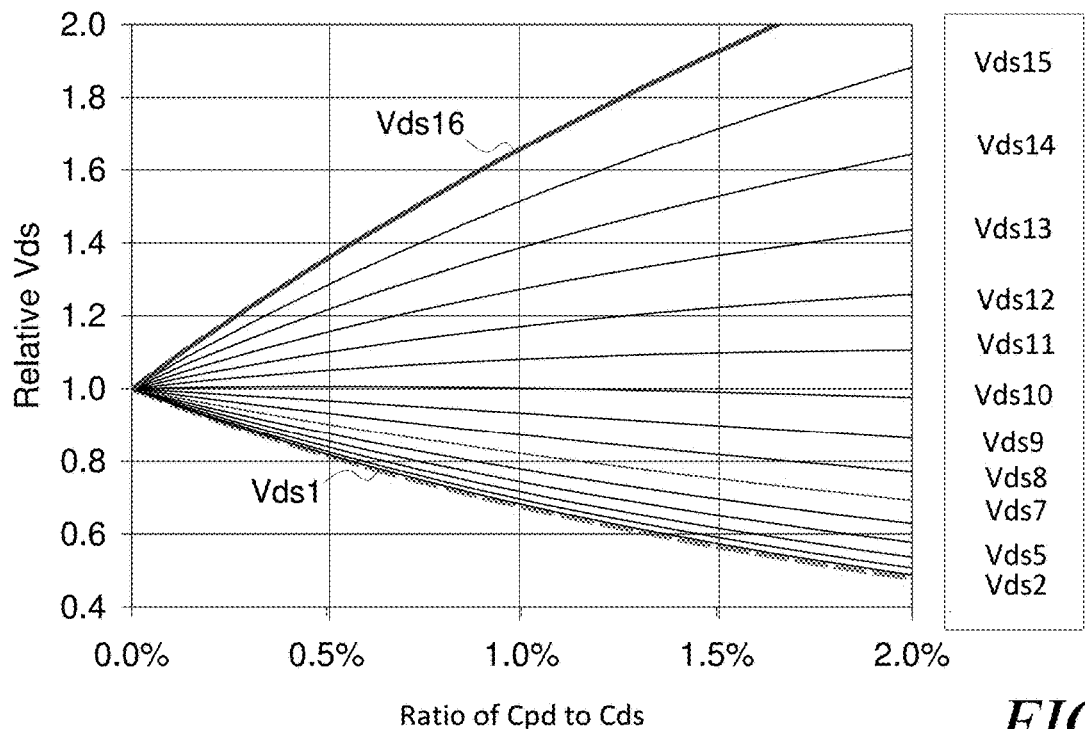
FIG. 7 is a graph illustrating the relative Vds of each of the transistors in a stack of 16 transistors as a function of a ratio of Cpd to Cds values.

FIG. 7 is a graph showing the relative distribution of the drain-source voltage Vdsn for each of the FETs (n=1 to 16) in a stacked RF switch, as a function of the size of Cpd with respect to Cds. Relative Vds is the Vds for each $FET_n$, compared to the voltage of $N_2/j$. Because j is 16 in this example, Relative Vds is the Vds of the particular FET compared to 1/16 of the RF switch voltage. A curve is provided for each of the 16 FETs in the stack, which are labeled on the right side of the graph as space permits.

As expected from consideration of FIG. 5, FIG. 7 shows that the disparity between the ideal expected voltage across each $FET_n$ is most pronounced at the ends of the stack, i.e., for n=1 and for n=16; and the magnitude of the $Vds_n$ increases for higher values of n. Indeed, $FET_{16}$ experiences a relative voltage 200% larger than the ideal value (Relative Vds=2) when each Cpd is just 1.6% as large as Cds. The assumptions for this figure are that each Cds has the same value, each Cpd has the same proportional value of Cds, and each Cpd is coupled to a node that is the RF signal equivalent to the voltage at the source connection of FET $M_1$, e.g., ground.

Figure 8:
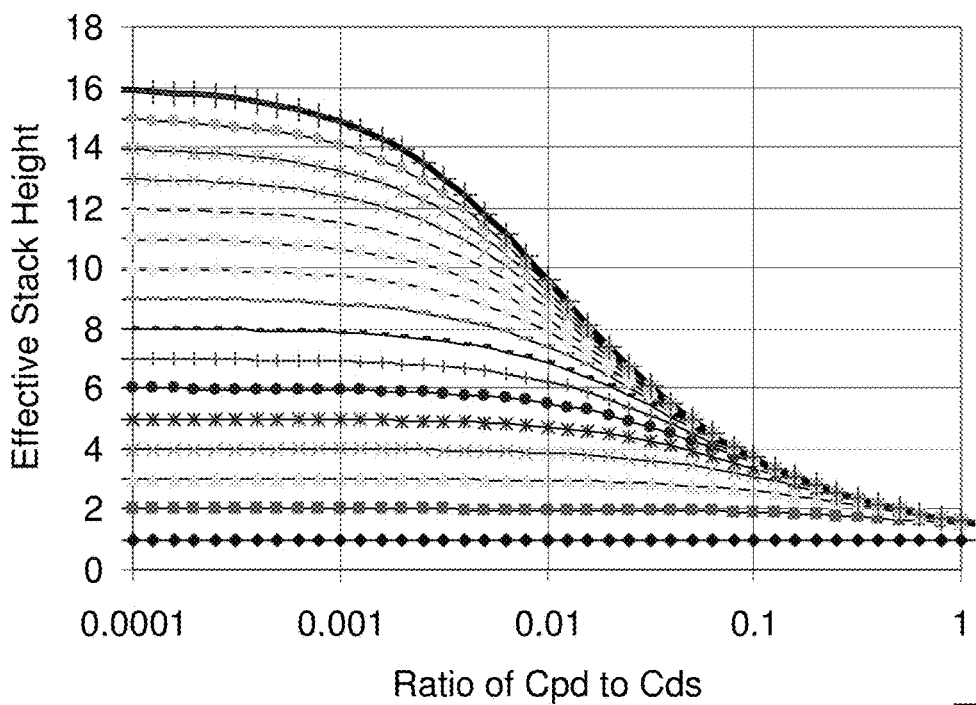
FIG. 8 is a graph illustrating the effective number of transistors in transistor stacks having 2 to 16 transistors, as a function of a ratio of Cpd to Cds values.

FIG. 8 also reflects the effect of uncompensated Cpd capacitances as a function of the ratio of Cpd to Cds. The Effective Stack Height is the actual withstand voltage of the RF switch in units of BVds, which is assumed the same for each stack transistor. The Effective Stack Height for stacks of j FETs are shown for actual stack heights j=1 (no stack at all) to 16 transistors. When the drain parasitic capacitances Cpd are very small (0.0001, or 0.01% as large) compared to the drain-source capacitances Cds, the stack operates nearly ideally, with a withstand voltage of j multiplied by the BVds of each FET. Thus, when the Cpd/Cds ratio=0.0001, a stack of 13 FETs (j=13) behaves essentially like an ideal stack of 13 devices, and hence it begins at an effective stack height of 13. Each other trace similarly begins at an Effective Stack Height value equal to the actual stack height of the switch, so the traces need no labeling. As the ratio of Cpd/Cds increases, the effective stack height decreases, because uncompensated Cpd values cause unequal distribution of voltage over the FETs of the stack, decreasing most rapidly for the largest stack (j=16). As the ratio of Cpd to Cds increases, the transistors no longer equally share the source voltage, and the top transistor in the stack, $M_j$, typically experiences significantly more voltage than any other transistor. When $M_j$ breaks down, the remaining transistors follow suit in a domino effect, so the effectiveness is limited by the voltage across $M_j$. For a stack of 16, the ideal breakdown voltage of the stack would be 16×BVds, but at a Cpd/Cds ratio of only 1.6% (0.016), it will fail at 8×BVds, thus having an effective stack height of 8.

For the special case, at least, it is thus clear that if Cpd values are not taken into account the stack is likely to fail at a much lower voltage than expected. The FET that is positioned furthest from the ground connection of an RF switch will most likely fail first, at a total RF switch voltage that may be a fraction of the ideal or expected peak voltage. Some solutions to this problem are set forth below for the special case, followed by a generalization of the problem and corresponding general solutions.

Solutions for the Special Case

Figure 6:
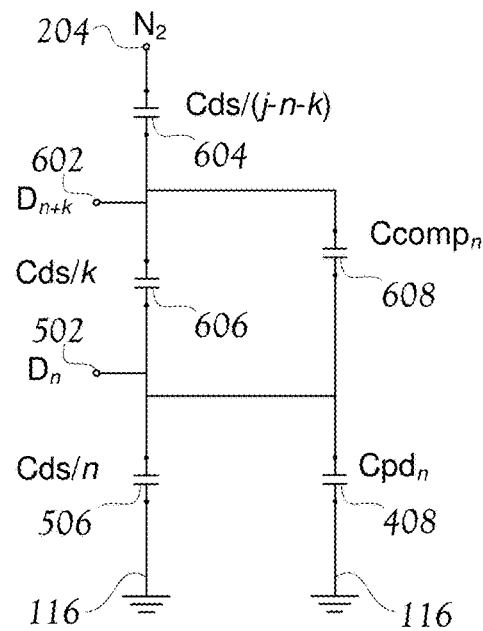
FIG. 6 is an equivalent circuit illustrating an addition of tuning capacitance between stack nodes to compensate Cpd in a circuit such as represented by FIG. 5.

FIG. 6 is an equivalent circuit similar to that of FIG. 5, and illustrates a set of solutions that differ from each other according to a value of k. To compensate or tune a node $D_n$ 502, a node $D_{(n+k)}$ 602 is selected based on factors such as ease of layout and effectiveness of the node 602. Nodes of higher k may be more effective, as described below. As an example, if j=16 and n=10, k may be set to any value from 1 to 6 (i.e., j–n). Selection of the node 602 results in a capacitor 604 composed of the series combination of those Cds that are above $D_{(n+k)}$ 602. Capacitor 604 therefore has a value of Cds/(j–n–k), for k<(j–n). When k=(j–n), of course, there is no capacitor 604 because $D_{(n+k)}$ 602 is tied directly to $N_2$ 204. As in FIG. 5, a capacitor 506 represents the series combination of the Cds of all FETs up to FET $M_n$ and hence has a value of Cds/n. The capacitor 506 is coupled, together with $Cpd_n$ 408, to ground 116. Tuning is achieved by adding a compensation capacitor $Ccomp_n$ 608 to compensate for the disruptive effects of $Cpd_n$ 408.

In one conceptually simple solution, k=(j–n) so that $D_{(n+k)}$ 602 is tied directly to $N_2$ 204. Perfect tuning of $D_n$ 502 is then readily achieved by making $Ccomp_n$ 608 equal to $Cpd_n*(n/k)$. This turns out to be the solution for any value of k. Such tuning is an iterative process, because the node $D_{(n+k)}$ 602 will need to be subsequently compensated due to the effect of $Ccomp_n$ 608. In this special case (Cpd components all effectively coupled to the source of $M_1$), solutions of the form illustrated in FIG. 6 are most readily implemented by first compensating the node $D_1$ ($Cdp_1$), and then proceeding to compensate each successive drain node.

It may be useful in some embodiments to let k=1, such that $Ccomp_n$ is simply disposed parallel to the channel of $M_{(n+1)}$. One advantage may be the relative simplicity of disposing $Ccomp_n$ between two nearby nodes. Another advantage may follow if the design of $M_{(n+1)}$ can be altered such that the inherent capacitance $Cds_{(n+1)}$ is significantly increased. Changes to the layout and design of the transistors $M_1$ to $M_j$ may reduce the size of the needed Ccomp capacitances, and may even obviate a need for some discrete Ccomp capacitances.

On the other hand, if k>1 (i.e., if Ccomp is coupled to a drain of a transistor higher in the stack), then the actual capacitance required for such Ccomp will generally be proportionally reduced as k increases. Note, however, that the breakdown voltage of such Ccomp must correspondingly increase. To implement the special case solution when k>1 requires discrete Ccomp capacitors to bridge a plurality of FETs. In the special case (i.e., when the various effective Cpd are predominantly coupled to a node equivalent to the end of the RF switch that is coupled to the lowest transistor $M_1$), a k>=1 solution may be implemented by disposing Ccomp capacitors between drain nodes $D_n$ and a drain $D_{(m>n)}$. Drain $D_{(m>n)}$ may, for example, be a node equivalent to the end of the RF switch to which $M_j$ is coupled.

The desirability of such coupling to drains of FETs that are more remote in the stack depends on the fabrication parameters and layout of the target RF switch. Factors tending to make such remote-node coupling desirable include: a) a layout that lends itself to such connection, especially if the Ccomp layout create no further undesirable parasitic capacitances; b) availability of a capacitor suitable for voltages greater than BVds; and c) a dearth of space available for such capacitors. Indeed, if the breakdown voltage BVc of a compensating capacitor is sufficiently high, it may be useful to couple the compensating capacitor to that endnode of the RF switch that is opposite the node to which the Cpd to be compensated is most closely coupled. The capacitance required for a compensation capacitor is proportional to 1/m, where m is the number of series FETs across which such compensation capacitor is coupled. This effect may permit compensation capacitors disposed across a plurality of FETs to occupy less die area, which is almost always beneficial.

The best tuning embodiment thus depends, among other things, on the accessibility of the various drain nodes, as well as on the suitability of capacitors that are compatible with the fabrication parameters, as well as on the space available for such capacitors and whether or not they can be fabricated atop other structures without adding die area. If tuning creates difficulties in layout, it may be desirable to compensate less than perfectly, permitting j to increase slightly.

A further tuning solution applies to the special case (in which each Cpd is coupled to ground or $N_1$), and in a basic form uses compensation capacitance only across single transistors (i.e., k=1). Conceptually, this further solution first compensates for $Cpd_1$ by increasing the effective $Cds_2$ by an amount equal to $Cpd_1$. Next it compensates for $Cpd_2$ by increasing the effective $Cds_3$ by an amount equal to $Cpd_2$, but increased by a factor of 2 (i.e., $2Cpd_2$) because $Cpd_2$ is coupled across two transistors, $M_1$ and $M_2$. Furthermore, $Cds_3$ must be increased over $Cds_2$, which has already been increased by the value of $Cpd_1$. All Cpd being equal, and all original Cds being equal, and for n>1, each effective Cds should be increased by an amount $Ccomp_n$ determined according to the following geometric progression:

$$Ccomp_n = \sum_{i=1}^{n-1} i \times Cpd_i \qquad \text{(Eqn. 0)}$$

Though conceptually described as beginning with compensation of $Cpd_1$, note that the equation may be evaluated in any order. All compensations must be present at the time of fabrication, of course, and thus there can really be no "order" of compensation.

Compensation or tuning can rarely be absolutely precise, and the value of further precision certainly approaches zero for uncompensated Cpd values that are 0.01% of Cds or less. Smaller stacks tolerate greater imprecision. In the case illustrated in FIG. 5, the single $Cpd_{15}$ that was presumed present resulted in a $Vds_{16}$ increased over the ideal value by only a factor of 1.28. Yet FIG. 7 suggests that the result for the same transistor, $M_{16}$, when each drain has a corresponding Cpd, would be that $Vds_{16}$ have approximately a factor of 2.2 greater than the ideal. Thus, while a single parasitic capacitance may not be negligible, it is unlikely to cause severe voltage distribution imbalances by itself. Therefore, errors in tuning any one particular node may be unimportant if most of the nodes are reasonably well tuned.

Moreover, even imprecise tuning may substantially raise the voltage withstand capacity of a stacked-transistor RF switch. For example, when the Cpd capacitances of a stacked-transistor RF switch design are predominantly coupled to a first endnode of an RF switch, improvements in switch voltage withstand may be realized by progressively increasing the net effective Cds for transistors that are progressively farther from the first endnode. Such general, progressive increase may be achieved, for example, by modifying transistor designs, and/or by adding discrete compensating capacitances. Such a general, imprecise solution may be as described in regard to FIG. 6, with k=1.

General Case Circuits and Solutions

In practice, parasitic capacitances from internal nodes can couple to any number of places. In a standard CMOS IC they may couple to the substrate. In SOI or GaAs devices they may couple to the package or metal on the back of the part. In all types of devices, the parasitic capacitances can also couple to nearby metal lines. Constituent Cpd capacitances coupled to any node having a signal comprising $X*V_{N1} - Y*V_{N2}$ may limit the RF handling capability of large stacks to less than jxBVds.

Not only the effective Cpd of a drain node, but also the effective Cds and/or the effective Ccomp may be comprised of a plurality of distinct constituent capacitances. The constituents of an effective Cpd capacitance may well be coupled to a multiplicity of different circuit nodes, as may constituents of Ccomp. Cds are coupled between particular nodes, but may still comprise a plurality of constituent capacitances. Consequently, the general case is far more complicated than the special case described above.

Figure 9:
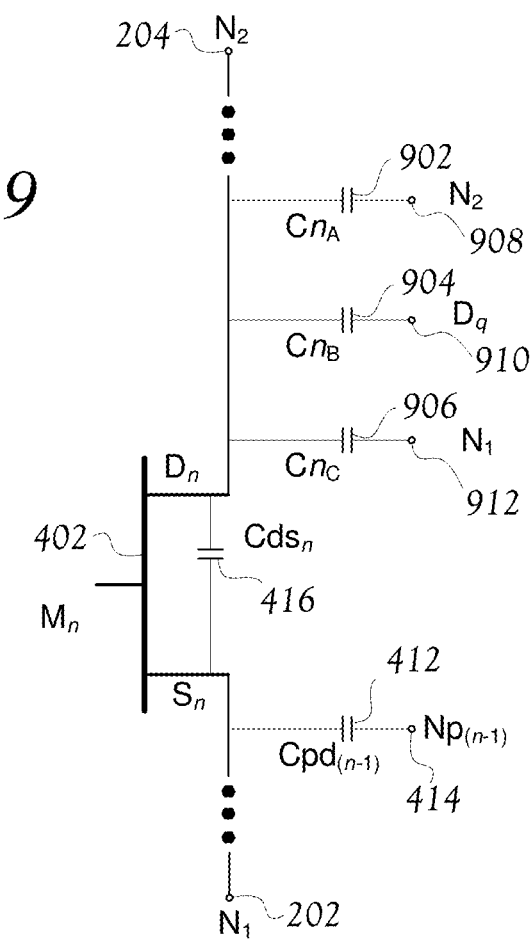
FIG. 9 schematically illustrates further capacitance details of circuits such as illustrated in FIG. 4.

FIG. 9 expands upon a portion of FIG. 4 to illustrate such greater complexity. FIG. 9 illustrates $M_n$ 402 of FIG. 4, together with $Cpd_{(n-1)}$ 412, which is coupled to the source node $S_n$ and to the corresponding terminal node $Np_{(n-1)}$ 414, and the two endnodes $N_1$ 202 and $N_2$ 204 of the RF switch. FIG. 9 illustrates an expansion of the effective $Cpd_n$ 408 of FIG. 4, or an expansion of an effective compensation capacitance Ccomp, or both. In the first case, $Cn_A$ 902, $Cn_B$ 904 and $Cn_C$ 906, which are terminated at nodes 908, 910 and 912 respectively, represent constituent capacitances of $Cpd_n$ 408. Node 908 is the RF equivalent of the second end of the RF switch, $N_2$ 204, while Node 912 is the RF equivalent of the first end of the RF switch, $N_1$ 202. Finally, node 910 is the RF equivalent of a different drain, $D_q$. $Cpd_n$ 408 represents the parallel combination of such constituent capacitances, so the total capacitance of $Cpd_n$ 408 will be the sum of the three values of $Cn_A$, $Cn_B$ and $Cn_C$, presuming there are no other significant Cpd constituents.

In this general case, the equivalent node $Np_n$ 410 of FIG. 4 may well not be an actual node. However, in any event, it is a mathematical equivalent node having an equivalent signal content based on the signal voltages of $N_2$, $N_1$, and on the relative magnitudes of $Cn_A$ 902, $Cn_B$ 904 and $Cn_C$ 906. It may be useful to determine whether the effective signal on the equivalent node $Np_n$ 410 is closer to the signal on $N_2$ or the signal on $N_1$. The relevant signal components of the (net effective) $Cpd_n$ will most often cause the signal to fall somewhere between the ideal voltage of $D_n$ and the voltage of $N_2$, or else between the ideal voltage of $D_n$ and the voltage of $N_1$. In the former case, $D_n$ is properly said to be more closely coupled to $N_2$ than to $N_1$, while in the latter case $D_n$ is properly said to be more closely coupled to $N_1$. With $M_1$ coupled to $N_1$ (as shown in FIG. 4), compensation of effective $Cpd_n$ that is more closely coupled to $N_1$ requires an increase in capacitance between $D_n$ and one or more nodes that are more closely coupled to $N_2$. The converse is also true: compensation of effective $Cpd_n$ that is more closely coupled to $N_2$ requires an increase in capacitance between $D_n$ and one or more nodes that are more closely coupled to $N_1$. For each drain node n, the effect of each constituent of Cpd may be calculated as described with respect to FIG. 6, and the effects of all such constituents combined to determine the effective $Cpd_n$.

In an alternative view of FIG. 9, the capacitances $Cn_A$ 902, $Cn_B$ 904 and $Cn_C$ 906, instead of exclusively representing constituents of a Cpd, represent constituents of both a Cpd and of a Ccomp. According to one example of this view, node 912 is $N_1$, and capacitor $Cn_C$ 906 comprises substantially all of $Cpd_n$. Node 910 ($D_q$) is the next higher drain, $D_{(n+1)}$ (i.e., q=n+1), and consequently the $Cn_B$ 904 represents an increase in effective drain-source capacitance $Cds_{(n+1)}$. $Cn_B$ 904 may, for example, be a discrete capacitor, or it may reflect an increase in Cds resulting from design modification of $M_{(n+1)}$. Further, it may reflect a combination of both means. Node 908 is an RF equivalent to $N_2$, so $Cn_A$ 902 may be a small discrete capacitor coupled between $D_n$ and $N_2$. Capacitances 902 and 904 are constituents of $Ccomp_n$. Values of the capacitances 902, 904 and 906, together with any disparity between $Cds_n$ and $Cds_{(n+1)}$ not encompassed by $Cn_B$ 904, should be established to satisfy Eqn. 1, as described below. Of course, Ccomp may have any number of constituent capacitances; and, as described above for determining the effective Cpd, the effect of each Ccomp constituent may be individually determined and then combined as the effective $Ccomp_n$.

A general rule for tuning or compensation of a node m, which is the drain of a stacked transistor, is set forth below. Each capacitance Cim is disposed between the node m and a different node i. Node m (in operation, with the RF switch in high impedance or off state) will have a voltage Vm, and under the same conditions each other node i will have a voltage Vi. P is the total number of distinct capacitors tied to node m. Based on calculation of charge injection to the node m, then, balance (and thus uniform voltage distribution) may be achieved by establishing that:

$$0 = \sum_{i=0}^{P-1} (Vi - Vm) \times Cim. \quad \text{(Eqn. 1)}$$

To the extent that Cds for the transistor immediately above node m and Cds for the transistor immediately below node m are equal, they may be ignored if the voltage is uniform on those two transistors, i.e., if [V(m+1)−V(m−1)]/2=Vm. However, if the Vds above and below node m are not going to be established to be equal in magnitude (and opposite in sign), then each Cds must be included in the calculation. Even if the Vds are equal, the Cds values should be included in the summation at least to the extent that they are significantly unequal.

Precision is helpful up to a point, but as noted above, precision is not always necessary to substantially improve voltage distribution imbalances across the transistors in a stacked RF switch. For some embodiments, it will suffice to observe that the Cpd are, on average, more closely coupled to $N_1$ than to $N_2$, and accordingly to establish values for Cds that are significantly increasing (e.g., increasing by more than 0.03%) for a majority of the FETs, rather than being substantially equal or varying randomly. Many embodiments of the devices and methods described herein achieve compensation for undesirable parasitic capacitances in a stacked FET RF switch by adding compensating capacitances coupled between nodes of transistors in the stack, particularly between drain nodes (or source nodes, which are equivalent). Such compensating capacitances may cause adjacent FETs in a stack to have significantly different net values of Cds, or may establish a compensating network of capacitance that is parallel to the series Cds string of the FET stack.

Adding Compensation Capacitance:

Cds is described as an effective drain-source capacitance, and herein means the total effective drain-source capacitance, net of intentional and unintentional capacitances and effects, unless a different meaning is made clear. Net effective Cds may be changed, for example, by simply coupling a predominantly capacitive feature between the drain and source nodes of a transistor in an RF switch stack. A predominantly capacitive feature is a passive element having an impedance at the frequency of a switched signal that is more capacitive than inductive or resistive. As circuit designers will understand, many structures may be fabricated that function as capacitors, and any such capacitor or predominantly capacitive feature or element may constitute a compensation capacitor or capacitance.

A compensation capacitance may include a difference between the intrinsic Cds of different constituent transistors of a stack, at least to the extent that such difference is an intentional result of specific design variations between such transistors. A particular constituent FET of a stack may have a different layout, or otherwise be designed or fabricated differently, from another constituent FET to achieve a desired difference in Cds values between such FETs. The manner in which Cds is achieved is not important to the devices and methods described herein; instead, any technique may be employed to establish satisfactory effective Cds values. Thus, any significant or intentional difference between the effective Cds of different transistors in a stack may fairly be considered to represent compensation capacitance.

When modifying individual transistor designs to vary their effective Cds is feasible, such modification may at least partly tune the capacitance of a transistor stack. Such modification may be very elegant. However, the required differences in design may be tedious to implement, and also may be relatively difficult to reestablish when a circuit must be modified for unrelated reasons. Nonetheless, such modification may provide some or even all of the compensation capacitance needed to satisfactorily tune the capacitances of a stacked transistor RF switch.

The simplest design modification for varying effective Cds is a simple change in device size. A larger device intrinsically has a larger value of Cds, so physically larger transistors may be used when larger Cds is required. Indeed, intrinsic Cds may well be substantially proportional to device size. In the special case in which Cpd capacitances are predominantly coupled to one endnode (the "bottom") of the RF switch, the transistors at the top of the stack require more compensation capacitance. In that case, the higher n transistors may be made progressively larger, either in lieu of, or in addition to, adding discrete capacitance between nodes of the series string of the stack.

The general idea of varying transistor size to at least partially supplant a need for discrete compensation capacitors applies to the general case of tuning stacked transistor switches. However, the following analysis particularly applies to the special case of a stack as described above and represented by FIG. 4, with the assumption made above for FIGS. 5 and 6 that each Cpd is coupled to a node equivalent to the lowest endnode ($N_1$, to which $M_1$ is coupled) of the RF switch. The width $W_n$ of each transistor $M_n$, n>1, may be determined as follows for the special case, with $W_1$ selected to establish overall switch resistance to satisfy performance requirements:

$$W_n = W_1 \prod_{i=1}^{j-1} \frac{Cds_i + i \times Cpd_i}{Cds_i} \quad \text{(Eqn. 2)}$$

Because Cds is generally a linear function with transistor width, while Cpd will typically be non-linear, eqn. 2 cannot readily be further simplified, nor made precise. Ideally, a stack tuned in accordance with Eqn. 2 will also satisfy the requirements of Eqn. 1, as set forth above.

Capacitances fabricated using gate insulation may be employed for tuning, though they may, for example, have a relatively low breakdown voltage, or be nonlinear. Moreover, because parasitic capacitance is often proportional to layout area, adding such compensating capacitors to the side of a transistor may create further parasitic capacitance. This may make tuning an iterative process, because the solution to the problem changes with each addition of compensation.

Metal-Metal (MIM) capacitance disposed on top of the switch transistor itself may be the best solution in some cases. Thus located, MIM capacitors may not require extra die area, and typically add no extra parasitic capacitance to ground, at least. Moreover, establishing a desired capacitance with a MIM capacitor is relatively simple, and consequently is likely to be easier to revise for subsequent design iterations, as compared to solutions based on modifying the transistor design. MIM capacitors may also have higher breakdown voltages, and thus may be amenable to being coupled between nodes m and i that are separated by a plurality of transistors (i.e., k>1 with respect to FIG. 6).

Identifying and Quantifying Effective Tuning

A voltage Vsw applied to an RF switch comprised of j constituent stacked transistors is distributed across the constituent transistors of the stack. Deviation from uniformity in the distribution may be quantified as the variance V of the portion of Vsw appearing on each transistor, where $Vds_i$ for each transistor $M_i$ resulting from Vsw is Vi, and $$V^2 = \left( \sum_{i=1}^{j} (Vi - Vsw/j)^2 \right) / j.$$

Useful tuning of a stacked transistor RF switch will result in a smaller variance V for the distributed voltages across the constituent transistors of the stack. Random process variation will inevitably cause small differences between the Cds of different transistors in a stack. However, because a design with no variation will be as perfect as possible, such random variations should generally act to increase the variance of the distributed transistor voltages. Accordingly, intentional tuning through control of Cds, on the one hand, and random, unintentional variations in the values of Cds on the other hand, may be distinguished by a showing of whether reducing the variation in Cds in a device or method (making the Cds of constituent transistors more uniform) would decrease or increase the variance in voltage distribution across the stack. The variance will increase as a result of reducing the Cds variations that serve to effectively tune a stacked switch.

Variance in voltage distribution across constituent transistors can similarly distinguish distribution tuning capacitance that is coupled to an internal node of the series string of a stacked-transistor switch. Upon omission of the predominantly capacitive elements coupled to internal nodes of the switch in an RF switch embodiment as described herein, the variance of the voltage distribution will increase if they are distribution tuning capacitances. Conversely, if capacitance has been coupled to internal string nodes for purposes other than tuning to increase voltage withstand capacity, then removing such capacitance will decrease the variance of voltage distribution.

Random process variation in Cds values can be distinguished from variations implemented intentionally to increase voltage withstand tuning by the magnitude of the maximum Cds variations. Thus, for the constituent transistors of a stack on a particular device, the largest Cds will be very close to the smallest Cds if the deviation is merely due to random process variations. For tuning a stack of j transistors, a size comparison (Cds(max)/Cds(min)−1) may be required to be at least j/200, or at least j/100, or at least j/50. Irrespective of j, a tuned stack of transistors may be required to have a Cds(max) that exceeds Cds(min) by at least 2%, at least 5%, or at least 10%, or at least 20%. Any of these limitations may be explicitly added to any claim of method, process or apparatus in order to distinguish incidental designs that are not intended to be encompassed by such claim.

Differences in net effective Cds values between adjacent pairs of transistors in a series stack may be required to be at least 0.5% for each of a majority of such adjacent pairs. Alternatively, differences in such net effective Cds values between adjacent pairs of transistors may be compared to a total Cpd (not including Cds constituents) for the internal node of the string that is between the transistors of such pair. The Cds differences may then be required to exceed the total Cpd for the node between them, for at least half, or for a majority, of such adjacent pairs. The calculation may also be made by averaging, such that a sum of Cds differences between all adjacent transistor pairs is required to exceed a sum of the total Cpd for the node(s) between such pairs.

Determining Cpd Values

The integrated circuit designer is often faced with a need to evaluate circuit parasitic elements, and any such technique may be employed to establish the parasitic drain capacitances Cpd to nodes other than the corresponding source, as well as the parasitic drain-source capacitance Cds. Complete circuit simulation based on the detailed parameters of the selected fabrication process and layout is ideal, if the simulation program is accurate and sufficient processing power is available to complete the task in a reasonable length of time. It is also possible to build a circuit, probe (measure) the distribution of the RF switch voltage across the individual transistors of the stack, and to deduce the effective Cpd values from such measurements. However, as noted above, a substantial improvement in RF switch voltage withstand capacity may be achieved even without perfect compensation. Accordingly, less demanding techniques may be employed to estimate Cpd values.

One example of such a technique to estimate parasitic capacitance from a node to substrate is as follows:

$$C = L\varepsilon \left\{ \frac{w}{h} + 0.77 + 1.06 \times \left[ \left(\frac{w}{h}\right)^{0.25} + \left(\frac{t}{h}\right)^{0.5} \right] \right\}, \quad \text{(Eqn. 3)}$$

where w and L are the width and length of the node, t is the thickness of the node, h is the height of the node above the ground plane, $\varepsilon = \varepsilon_o \times 8.854\text{e-}12 \text{F/m}$, and $\varepsilon_o$ is the relative permittivity of the substrate material.

Numerous computer programs exist to aid the designer in estimating parasitic circuit elements. Programs such as Medici, ADS/Momentum, FastCap, HFSS, and others are capable of 2D and 3D parasitic capacitance estimation. These tools enable more accurate estimation of capacitance to all other nodes in the vicinity of the node(s) being analyzed.

Conclusion

The foregoing description illustrates exemplary implementations, and novel features, of related methods of tuning or compensating the capacitances of stacked-transistor RF switches to alleviate low breakdown voltages for such switch that would otherwise result from imbalances in the distribution of the overall RF switch voltage across the transistors of the stack. It also describes implementations and novel features of integrated circuit stacked-transistor RF switches, apparatus that employ capacitive tuning or compensation features to improve net breakdown voltage compared to the absence of such features. The skilled person will understand that various omissions, substitutions, and changes in the form and details of the methods and apparatus illustrated may be made without departing from the scope of the invention. Because it is impractical to list all embodiments explicitly, it should be understood that each practical combination of the features set forth above (or conveyed by the figures) as suitable for embodiments of the apparatus or methods constitutes a distinct alternative embodiment of an apparatus or method. Moreover, each practical combination of equivalents of such apparatus or method alternatives also constitutes a distinct alternative embodiment of the subject apparatus or methods. Therefore, the scope of the presented invention should be determined only by reference to the appended claims, as they may be amended during pendency of the application, and is not to be limited by features illustrated in the foregoing description except insofar as such limitation is recited, or intentionally implicated, in an appended claim.

The transistors in stacked-transistor RF switches as described herein are preferably of an insulated-gate type, or are biased so as to conduct no DC gate current. Even more preferably, the transistors are FETs, particularly those referred to as MOSFETs, though that includes many FETs that are not fabricated with traditional Metal/Oxide/Semiconductor layers, as was once implied by the name. The FETs have been described as if they are of N polarity (NMOS), but they could equally well be PMOS. Embodiments may employ non-preferred transistors, though they may require circuit adjustments to deal with control-node DC current.

The circuits illustrated and described herein are only exemplary, and should be interpreted as equally describing such alternatives as may be readily seen to be analogous by a person of skill in the art, whether by present knowledge common to such skilled persons, or in the future in view of unforeseen but readily-applied alternatives then known to such skilled persons.

All variations coming within the meaning and range of equivalency of the various claim elements are embraced within the scope of the corresponding claim. Each claim set forth below is intended to encompass any system or method that differs only insubstantially from the literal language of such claim, but only if such system or method is not an embodiment of the prior art. To this end, each element described in each claim should be construed as broadly as possible, and should be understood to encompass any equivalent to such element insofar as possible without also encompassing the prior art.

What is claimed is:

1. A voltage distribution-balanced stack of series coupled transistors, comprising:
   a stack of series coupled transistors;
   a plurality of internal nodes between pairs of adjacent transistors of the stack of series coupled transistors;
   at least one compensation capacitor coupled across at least one node of the plurality of internal nodes and ground to voltage balance the stack of series coupled transistors;
   a plurality of gate resistive impedances of the stack of series coupled transistors; and
   a plurality of gate capacitive impedances of the stack of series coupled transistors, wherein at least one gate resistive impedance of the plurality of gate resistive impedances and at least one gate capacitive impedance of the plurality of gate capacitive impedances combine to form a low pass filter.

2. A voltage distribution-balanced stack of series coupled transistors, comprising:
   a stack of series coupled transistors, wherein a first transistor of the series coupled stacked transistors has a first intrinsic drain-source capacitance Cds;
   internal nodes between adjacent transistors of the stack of series coupled transistors, at least one internal node of the internal nodes having a capacitance Cpd between the at least one internal node and a coupled node, wherein a ratio of the capacitance Cpd to the first intrinsic drain-source capacitance Cds is set at less than a predetermined value.

3. The voltage-distribution balanced stack of claim 2, wherein the capacitance Cpd is coupled to ground.

4. The voltage-distribution balanced stack of claim 2, further comprising at least one compensation capacitor coupled across at least two internal nodes of the plurality of internal nodes to voltage balance the stack of series coupled transistors.

5. The voltage distribution-balanced stack of claim 4, wherein the at least one compensation capacitor is coupled to ground.

6. The voltage-distribution balanced stack of claim 2, wherein
   a second transistor of the series of coupled stacked transistors has a second intrinsic drain-source capacitance Cds, wherein a difference between the first intrinsic drain-source capacitance Cds and the second intrinsic drain-source capacitance Cds is set at a predetermined amount.

7. The voltage distribution-balanced stack of claim 6, wherein the first transistor has a first transistor size and the second transistor has a second transistor size different from the first transistor size.

8. The voltage distribution-balanced stack of claim 7, wherein the first transistor size is smaller than the second transistor size.

9. The voltage distribution-balanced stack of claim 6, wherein the first intrinsic drain-source capacitance Cds is lower than the second intrinsic drain-source capacitance Cds.

* * * * *